(12) United States Patent
Chang et al.

(10) Patent No.: US 12,543,593 B2
(45) Date of Patent: Feb. 3, 2026

(54) SEMICONDUCTOR PACKAGE INCLUDING SEMICONDUCTOR DIES HAVING DIFFERENT LATTICE DIRECTIONS AND METHOD OF FORMING THE SAME

(71) Applicant: Taiwan Semiconductor Manufacturing Company Limited, Hsinchu (TW)

(72) Inventors: Jen-Yuan Chang, Hsinchu (TW); Chia-Ping Lai, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 252 days.

(21) Appl. No.: 17/477,629

(22) Filed: Sep. 17, 2021

(65) Prior Publication Data

US 2022/0320046 A1    Oct. 6, 2022

Related U.S. Application Data

(60) Provisional application No. 63/168,365, filed on Mar. 31, 2021.

(51) Int. Cl.
  *H01L 25/065*   (2023.01)
  *H01L 21/78*   (2006.01)
  *H01L 23/00*   (2006.01)

(52) U.S. Cl.
  CPC .......... *H01L 25/0657* (2013.01); *H01L 21/78* (2013.01); *H01L 24/08* (2013.01); *H01L 24/32* (2013.01); *H01L 24/83* (2013.01); *H01L 25/0652* (2013.01); *H01L 2224/08145* (2013.01); *H01L 2224/32145* (2013.01); *H01L 2224/80895* (2013.01); *H01L 2224/80896* (2013.01); *H01L 2224/83894* (2013.01)

(58) Field of Classification Search
  CPC . H01L 21/187; H01L 21/76251–76259; H01L 24/00–98; H01L 2224/00–98; H01L 33/0079; H01L 21/78; H01L 23/3157; H01L 23/3135; H01L 23/3185; H01L 23/3192; H01L 23/585; H01L 25/0657; H01L 25/0652; H01L 25/18; H01L 25/50; H01L 2224/08145; H01L 2224/32145; H01L 2224/80895; H01L 2224/80896; H01L 2224/83894; H01L 2224/80075; H01L 2224/94; H01L 2224/9512; H01L 24/08; H01L 24/32; H01L 24/83; H01L 24/80; H01L 24/94; H10N 30/072–073; H10K 71/50
  See application file for complete search history.

(56) References Cited

U.S. PATENT DOCUMENTS

| | | | | |
|---|---|---|---|---|
| 5,654,583 | A * | 8/1997 | Okuno | B82Y 20/00 257/614 |
| 2004/0173790 | A1 * | 9/2004 | Yeo | H01L 29/7842 438/181 |
| 2021/0043571 | A1 * | 2/2021 | Hou | H01L 21/56 |

* cited by examiner

*Primary Examiner* — Julio J Maldonado
*Assistant Examiner* — Stanetta D Isaac
(74) *Attorney, Agent, or Firm* — The Marbury Law Group, PLLC

(57) ABSTRACT

A semiconductor die stack includes a first semiconductor die having a first lattice direction, and a second semiconductor die bonded to the first semiconductor die and having a second lattice direction different than the first lattice direction.

20 Claims, 17 Drawing Sheets

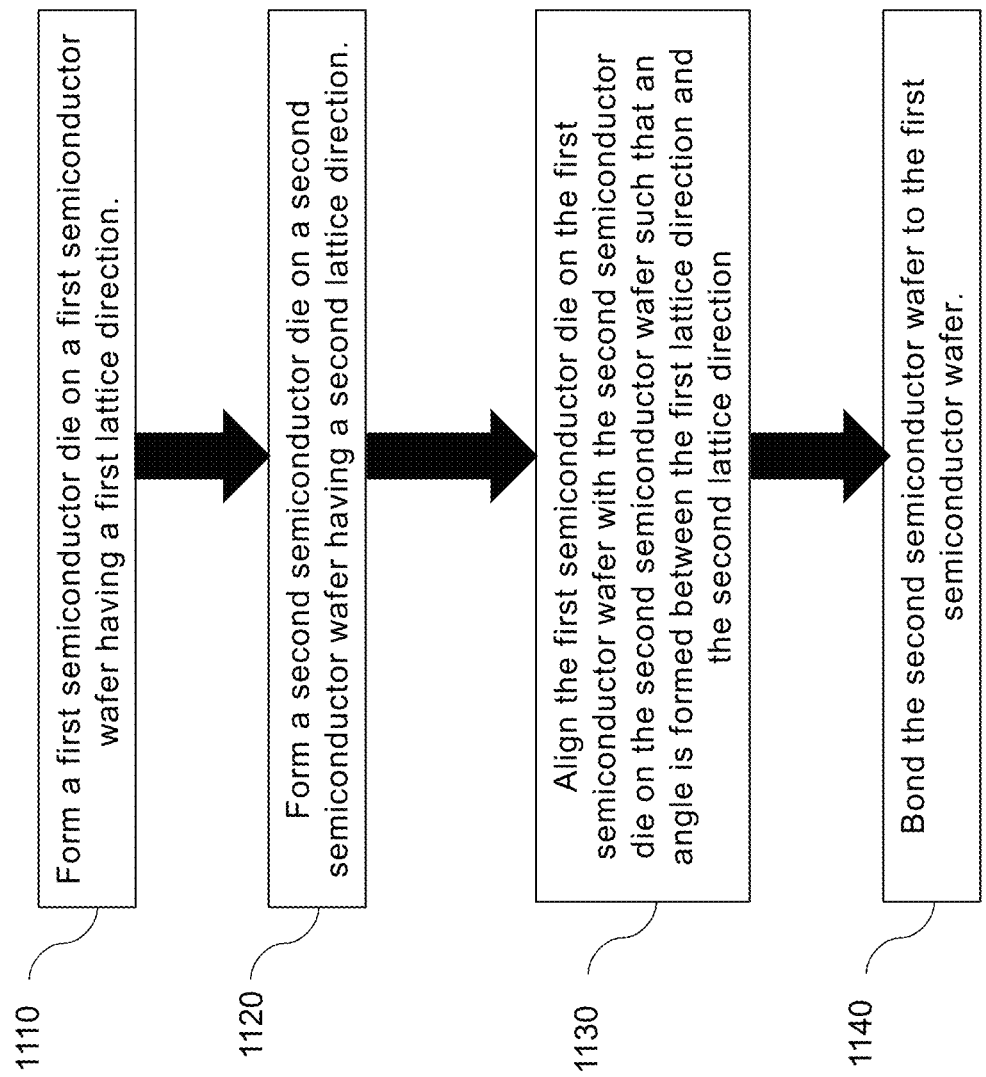

SEMICONDUCTOR PACKAGE INCLUDING SEMICONDUCTOR DIES HAVING DIFFERENT LATTICE DIRECTIONS AND METHOD OF FORMING THE SAME

RELATED APPLICATIONS

This application claims the benefit of priority from U.S. Provisional Application No. 63/168,365, entitled "SoIC stress reduction by wafer on wafer lattice shift," filed on Mar. 31, 2021, the entire contents of which are incorporated herein by reference for all purposes.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon. Dozens or hundreds of integrated circuits are typically manufactured on a single semiconductor wafer, and individual dies on the wafer are singulated by sawing between the integrated circuits along a scribe line. The individual dies are typically packaged separately, in multi-chip modules, or in other types of packaging, for example.

The semiconductor industry continues to improve the integration density of various electronic components (e.g., transistors, diodes, resistors, capacitors, etc.) by continual reductions in minimum feature size, which allow more components to be integrated into a given area. These smaller electronic components also require smaller packages that utilize less area than packages of the past, in some applications.

Three-dimensional integrated circuits (3DICs) are a relatively recent development in semiconductor packaging in which multiple semiconductor dies are stacked upon one another, such as package-on-package (PoP) and system-in-package (SiP) packaging techniques. A 3DIC may provide improved integration density and other advantages, such as faster speeds and higher bandwidth, because of the decreased length of interconnects between the stacked dies, as examples. Hybrid bonding may be one type of bonding procedure for 3DICs, where two semiconductor wafers are bonded together to form a wafer-to-wafer (WtW) bond.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 11 is process flow illustrating the operations of a method of forming a semiconductor die stack according to one or more embodiments.

DETAILED DESCRIPTION

Figure 1A:
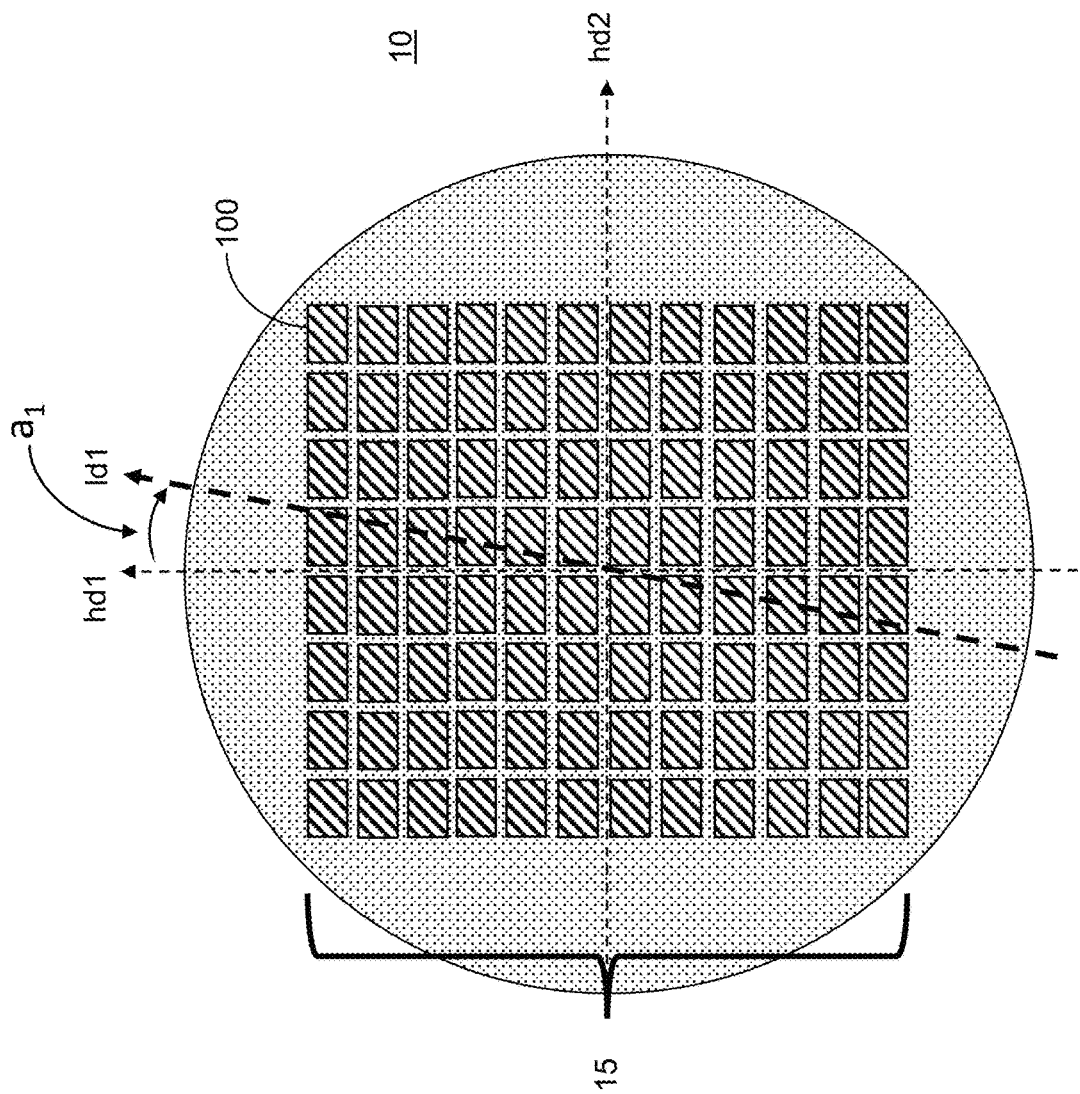
FIG. 1A illustrates a first semiconductor wafer according to one or more embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

Typically, in a semiconductor package (e.g., System of Integrated Circuits (SoIC) die) that includes at least two wafers bonded together by a wafer-to-wafer (WtW) bond (e.g., hybrid bond, fusion bond, etc.), variations of the materials and densities of the circuits and devices formed on the wafers may cause the bonded wafers to warp or deform at different rates. This warpage may cause a defect in the circuits and devices formed thereon. In particular, the WtW bond may not be sufficiently stress resistant, so that the semiconductor package may easily fracture and/or fragment during a process that utilizes high temperatures.

Within a semiconductor package, in instances in which the crystal lattice of the semiconductor dies that are included in the semiconductor package are oriented in the same direction, the crystal lattice may be easy to break in that direction. Similarly, within semiconductor wafers, in instances in which the crystal lattice of the wafers are oriented in the same direction, then the crystal lattice may be easy to break in that direction.

In the various embodiments of the present invention, a semiconductor package (e.g., SoIC die) may include a first semiconductor wafer that may have a first lattice that is oriented in a first direction, and a second semiconductor wafer bonded to the first semiconductor wafer. The second semiconductor wafer may have a second lattice oriented in a second direction different than the first direction. By orienting the direction of the first lattice and second lattice in different directions (e.g., lattice shifting), the stress imparted upon the first wafer that is bonded to the second wafer (e.g., by a WtW bond) in the semiconductor package may be reduced. Consequently, fewer circuits and devices formed thereon may suffer defects due to stress warpage of the wafers.

In order to avoid fragmentation, the lattice stress of the wafers (e.g., first semiconductor wafer and second semiconductor wafer) that are bonded together (e.g., by a WtW bond) may be separated and oriented in different directions. For example, an angle between a first lattice direction of a first semiconductor wafer (e.g., an upper wafer), and a second lattice direction of a second semiconductor wafer (e.g., a lower wafer) may be greater than 0.5 degrees. More preferably, the angle between a first lattice direction of a first semiconductor wafer and a second lattice direction of a second semiconductor wafer may be greater than 1 degree. Still more preferably the angle between a first lattice direction of a first semiconductor wafer and a second lattice direction of a second semiconductor wafer may be greater than 5 degrees, such as greater than 10 degrees, and still more preferably the angle may be 45 degrees.

A wafer-to-wafer (WtW) interface in a semiconductor package may include a hybrid bond and fusion bond. Unlike a 3DIC having a controlled collapse chip connection (C4) (e.g., a flip chip device) where the bond space may serve as a buffer, in a semiconductor package with a WtW bond, there may be no such no stress buffer. Therefore, fragments may be prone to fracture in a direction of a wafer lattice. By including a difference in wafer lattice direction between bonded wafers, a stress resistance may be increased. Thus, a unidirectional stress accumulation of the WtW bond in a semiconductor package (e.g., SoIC) may be avoided by shifting the wafer lattice directions, and as a result, a stress resistance of the WtW bond in the semiconductor package (e.g., SoIC) may be increased.

In some embodiments, a height of a first semiconductor die stack (e.g., SoIC chip) may be similar to a height of a second semiconductor die stack (e.g., a high bandwidth memory (HBM) die) that is formed on the same substrate (e.g., packaging substrate) with the first semiconductor die stack. A height difference between the first semiconductor die stack and the second semiconductor die stack may be limited such that the difference in height of each die stack are within 10% (e.g., +/−10%) of the other. For example, where the first semiconductor die includes a carry wafer (e.g., silicon wafer), a height of an upper surface of the carry wafer may be approximately the same as (e.g., matched to) a height of an upper surface of the second semiconductor die. By matching (+/−10%) the heights of a first semiconductor die stack and a second semiconductor die stack, the stress resistance of the wafer-to-wafer (WtW) bond in the first semiconductor die stack may be improved. In instances in which the height difference between the first semiconductor die stack and the second semiconductor die stack is greater than 10%, uneven stress distribution may occur after molding. Uneven stress may occur on the top or side.

In addition, an angle between the lattice direction of wafers/dies/chips may be greater than 0.5 degrees in the first semiconductor die stack. More preferably, the angle may be greater than 1 degree, such as greater than 5 degrees. In some embodiments, the angle may be greater than 10 degrees, such as 45 degrees.

The first semiconductor die stack (e.g., an SoIC chip) may be a silicon-based die stack (e.g., HBM) or a non-silicon-based die stack (e.g., glass, polymer, etc.). The first semiconductor die stack may also be composed of different crystal lattice directions to improve the strength of the first semiconductor die stack. By forming other die stacks on the same substrate (e.g., packaging substrate) as the first semiconductor die stack, (e.g., different die stack combinations), an overall stress strength of the first semiconductor die stack may be improved to withstand stress and avoid cracks by orienting the lattice directions of the different die stack s in different directions.

Referring to the drawings, FIG. 1A illustrates a first semiconductor wafer 10 according to one or more embodiments. The first semiconductor wafer 10 may include, for example, silicon, germanium, silicon germanium (SiGe), GaAs, InP, SiC, etc. In particular, the first semiconductor wafer 10 may include a single crystal silicon wafer and may have a first lattice direction (e.g., major in-plane crystallographic direction) ld1. The first semiconductor wafer 10 may also include materials other than semiconductor formed thereon. In particular, the first semiconductor wafer 10 may include a two-dimensional first array 15 of first semiconductor dies 100 formed on the first semiconductor wafer 10.

The first array 15 of first semiconductor dies 100 may be arranged on the first semiconductor wafer 10 as a periodic rectangular array having a first periodicity along a first horizontal direction hd1 and having a second periodicity along a second horizontal direction hd2 that is perpendicular to the first horizontal direction hd1. As illustrated in FIG. 1A, the first lattice direction (e.g., major in-plane crystallographic direction) ld1 may be offset from the first horizontal direction hd1 (and from the second horizontal direction hd2) by a respective offset angle $a_1$, which may be at least 0.5 degree, or more preferably at least 1.0 degree. Offsetting the first lattice direction ld1 of the first semiconductor wafer 10 from a direction of periodicity in the first array 15 of first semiconductor dies 100 may help to reduce deleterious effects (such as cracking of the first semiconductor wafer 10) due to mechanical stress during a subsequent packaging process (e.g., application of molding compounds and dicing) by directing the mechanical stress along a direction that is different than the first lattice direction ld1.

In one embodiment, the first semiconductor wafer 10 may include a commercially available silicon wafer. In one embodiment, the first semiconductor wafer 10 may be a (100) silicon wafer, i.e., a single crystalline silicon wafer having a planar major surface including a (100) crystallographic plane so that a [100] crystallographic direction of the single crystalline material of the single crystalline silicon wafer is perpendicular to the physically exposed planar (100) crystallographic plane. In this embodiment, the (100) silicon wafer may include a [010] direction and a direction selected from a pair of orthogonal in-plane horizontal directions, i.e., a pair of horizontal directions that are contained within the plane including the top surface of the silicon wafer. Alternatively, the (100) silicon wafer may include a [011] direction (which is a <110> direction) and a [0 1-1] direction (which is another <110>direction) selected from a pair of orthogonal in-plane horizontal directions.

Alternatively, the first semiconductor wafer 10 may be a (110) silicon wafer, i.e., a single crystalline silicon wafer having a planar major surface including a (110) crystallographic plane so that a [110] crystallographic direction of the single crystalline material of the single crystalline silicon wafer is perpendicular to the physically exposed planar (110) crystallographic plane. In this embodiment, the (110) silicon wafer may include a [1-1 0] direction (which is one of <110> direction) and a [001] direction selected from a pair of orthogonal in-plane horizontal directions. Alternatively, the (110) silicon wafer may include a [1-1 2] direction (which is one of <112> direction) and a [1-1-1] direction (which is one of <111> directions) selected from a pair of orthogonal in-plane horizontal directions.

In a further alternative, the first semiconductor wafer 10 may be a (111) silicon wafer, i.e., a single crystalline silicon wafer having a planar major surface including a (111) crystallographic plane so that a [111] crystallographic direction of the single crystalline material of the single crystalline silicon wafer is perpendicular to the physically exposed planar (111) crystallographic plane. In this embodiment, the (111) silicon wafer may include a [1-1 0] direction (which is one of <110> directions) and a [1 1-2] direction (which is one of <112> directions) selected from a pair of orthogonal in-plane horizontal directions.

As used herein, any in-plane crystallographic direction that may be included in a set of two orthogonal in-plane crystallographic directions with lowest Miller indices (i.e., Miller indices of which the sum of absolute values of the components of the Miller indices is the lowest) for a (100) semiconductor wafer, a (110) semiconductor wafer, and a (111) semiconductor wafer is herein referred to as a lattice direction (e.g., "major" in-plane crystallographic direction). Thus, the lattice directions of a single crystalline silicon substrate may include <100> directions, <110> directions, <111> directions, and <112> directions for the purposes of the present disclosure.

Figure 1B:
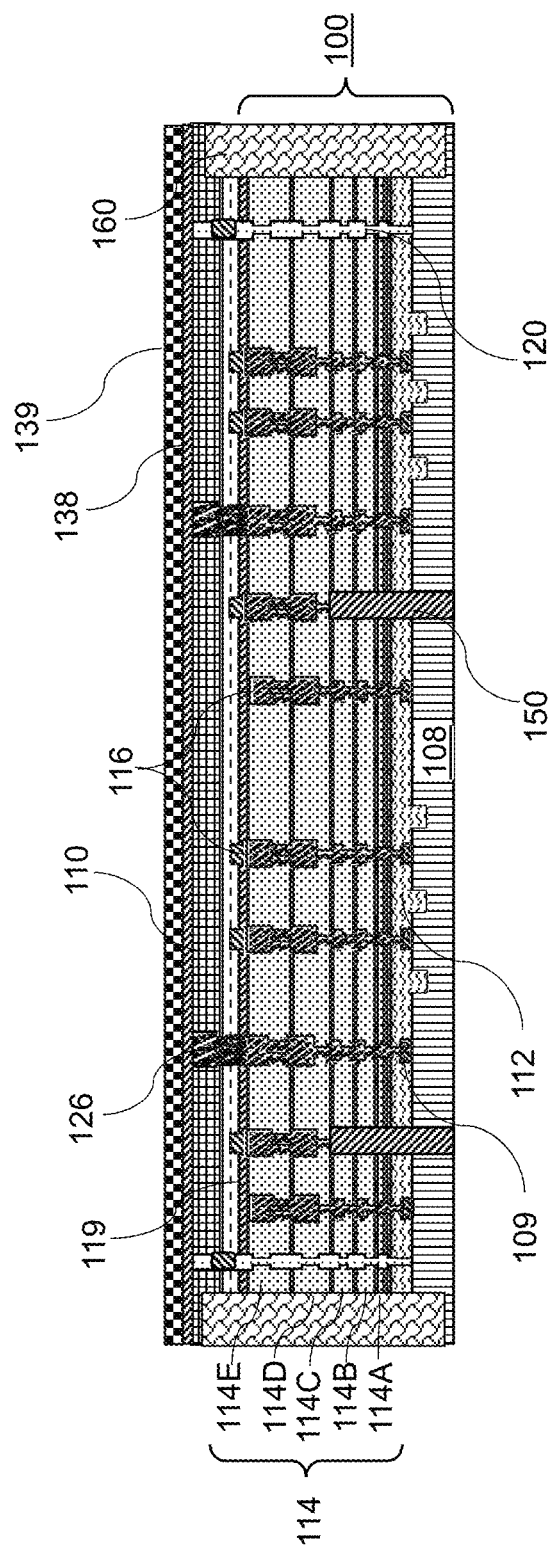
FIG. 1B is a vertical cross-sectional view of a first semiconductor die that may be formed (e.g., by a photolithographic process) in the first array on the first semiconductor wafer according to one or more embodiments.

FIG. 1B is a vertical cross-sectional view of a first semiconductor die 100 that may be formed (e.g., by a photolithographic process) in the first array 15 on the first semiconductor wafer 10 according to one or more embodiments. In some embodiments, the first semiconductor die 100 may include a first semiconductor substrate (e.g., silicon substrate) 108 that may be formed of the same material as the first semiconductor wafer 10. An interlayer dielectric (ILD) 112 may be formed on the first substrate 108 and an intermetal dielectric (IMD) 114 may be formed on the interlayer dielectric 112. The interlayer dielectric 112 and intermetal dielectric 114 may include, for example, undoped silicon glass (USG), fluorosilicate glass (FSG), etc.

The intermetal dielectric 114 may include a plurality of IMD layers 114A-114E which may be separated by various etch stop and seal layers. The etch stop and seal layers may include, for example, SiC, SiN, etc. A passivation layer 119 may be formed over the intermetal dielectric 114. In some embodiments, the passivation layer 119 may include silicon oxide (e.g., $Si_xO_y$), silicon nitride ($Si_xN_y$), benzocyclobutene (BCB) polymer, polyimide (PI), polybenzoxazole (PBO) or a combination thereof. Other suitable dielectric materials are within the contemplated scope of disclosure. The passivation layer 119 may be formed by a suitable process such as spin coating, chemical vapor deposition (CVD), or the like.

Metal features 116 may be formed in the intermetal dielectric 114. The metal features 116 may include, for example, conductive vias and metal lines. The conductive vias may be formed between and in contact with the metal lines. The metal features 116 may be formed of copper, copper alloys, aluminum, aluminum alloys, or some combination thereof. Other suitable conductive metal materials for use as the metal features 116 are within the contemplated scope of disclosure. One or more gate electrodes 109 may be formed on the first substrate 108, and the metal features 116 may be electrically connected to the gate electrodes 109.

In some embodiments, one or more seal rings 120 may be formed in the intermetal dielectric 114. The seal rings 120 may be electrically isolated from the metal features 116 and formed so as to encircle a functional circuit region of the first semiconductor die 100. The seal rings 120 may provide protection for the features of the first semiconductor die 100 from water, chemicals, residue, and/or contaminants that may be present during the processing of the first semiconductor die 100. The seal rings 120 may be formed of a conductive material (e.g., metal material) and more particularly, may be formed of the same material, at the same time, and by the same process as the metal features 116. More particularly, the seal rings 120 may include conductive lines and via structures that are connected to each other, and may be formed simultaneously with the metal lines and conductive vias of the metal features 116. For example, the seal rings 120 may include copper at an atomic percentage greater than 80%, such as greater than 90% and/or greater than 95% although greater or lesser percentages may be used.

In some embodiments, the metal features 116 and/or the seal ring 120 may be formed by a dual-Damascene process or by multiple single Damascene processes. Single-Damascene processes generally form and fill a single feature with copper per Damascene stage. Dual-Damascene processes generally form and fill two features with a metal (e.g., copper) at once, e.g., a trench and overlapping through-hole may both be filled with a single copper deposition using dual-Damascene processes. In alternative embodiments, the metal features 116 and/or the seal ring 120 may be may be formed by an electroplating process.

For example, the Damascene processes may include patterning the intermetal dielectric 114 to form openings, such as trenches and/or though-holes (e.g., via holes). A deposition process may be performed to deposit a conductive metal (e.g., copper) in the openings. A planarization process, such as chemical-mechanical planarization (CMP) may then be performed to remove excess copper (e.g., overburden) that is disposed on top of the intermetal dielectric 114.

In particular, the patterning, metal deposition, and planarizing processes may be performed for each of the intermetal dielectric layers 114A-114E, in order to form an interconnect structure made up of the metal features 116 and/or the seal ring 120. For example, dielectric layer 114A may be deposited and patterned to form openings. A deposition process may then be performed to fill the openings in the dielectric layer 114A. A planarization process may then be performed to remove the overburden and form metal features 116 in the dielectric layer 114A. These process steps may be repeated to form the dielectric layers 114B-114E and the corresponding metal features 116 and/or seal ring 120, and thereby complete the interconnect structure and/or seal ring 120.

In some embodiments, the first semiconductor die 100 may include one or more first conductive vias 150 that are connected to one or more of the metal features 116. The first conductive via 150 may extend, for example, from the metal feature 116 through the intermetal dielectric 114, interlayer dielectric 112, and first substrate 108. The first conductive via 150 may include, for example, copper, gold, silver, aluminum or the like, or an alloy of these metals such as aluminum copper (AlCu) alloy. Other suitable materials for use in the first conductive via 150 are within the contemplated scope of disclosure.

A dielectric encapsulation layer 160 may be formed on the first semiconductor die 100 so as to encapsulate at least a portion of the first semiconductor die 100. The dielectric encapsulation layer 160 may include, for example, silicon dioxide. Alternatively, the dielectric encapsulation layer 160 may include undoped silicon glass (USG), fluorosilicate glass (FSG), SiC, SiON, SiN, SiCN, a low-K film, an extreme low-K (ELK) film, phosphor-silicate glass (PSG) and tetra-ethoxy-silane (TEOS). Other dielectric materials for use as the dielectric encapsulation layer are within the contemplated scope of disclosure.

A bonding layer 110 may be formed on the passivation layer 119. The bonding layer 110 may be used, for example, to bond the first semiconductor die 100 to another structure (e.g., another semiconductor die, carry wafer, etc.). The material and formation method of the bonding layer 110 may be similar to those of the ILD 112. One or more bonding pads 126 or conductive vias (not shown) may be formed in the bonding layer 110 and contact (e.g., directly or indirectly) a metal feature 116 in the first semiconductor die 100. The bonding pads 126 or conductive vias may be formed of the same material as the metal features 116. In other embodiments, the bonding pads 126 and conductive vias may be formed of a different conductive material than the metal features 116.

The first semiconductor die 100 may also include a passivation layer 138 formed on the first semiconductor die 100. The passivation layer 138 may include, for example, silicon nitride, undoped silicate glass (USG) or silicon dioxide. A fusion bonding film 139 may also be formed on the passivation layer 138. The fusion bonding film 139 may include, for example, silicon oxynitride or silicon dioxide. Metal bumps (not shown) may be formed in the passivation layer 138 and fusion bonding film 139 so as to contact the metal bonding pads 126 that are connected to the metal features 116 of the first semiconductor die 100.

Figure 2A:
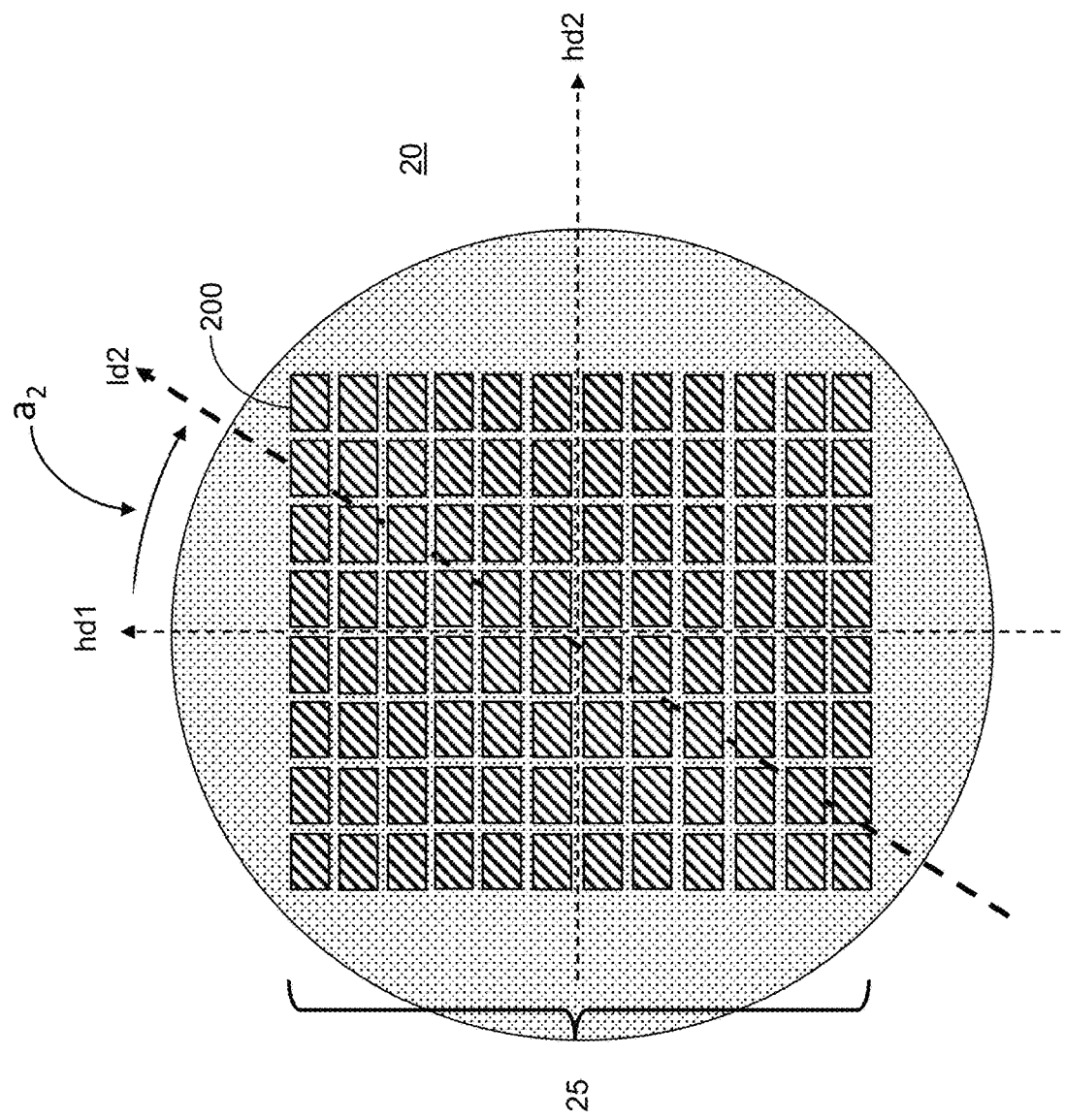
FIG. 2A illustrates a second semiconductor wafer according to one or more embodiments.

FIG. 2A illustrates a second semiconductor wafer 20 according to one or more embodiments. The second semiconductor wafer 20 may include, for example, silicon, germanium, silicon germanium (SiGe), GaAs, InP, SiC, etc. In particular, the second semiconductor wafer 20 may include a single crystal silicon wafer and may have a second lattice direction (e.g., major in-plane crystallographic direction) ld2. The second semiconductor wafer 20 may also include materials other than semiconductor formed thereon. In particular, the second semiconductor wafer 20 may include a two dimensional second array 25 of second semiconductor dies 200 formed on the second semiconductor wafer 20, for example, by using a photolithographic process.

The second array 25 of second semiconductor dies 200 may be arranged on the second semiconductor wafer 20 as a periodic rectangular array having a first periodicity along a first horizontal direction hd1 and having a second periodicity along a second horizontal direction hd2 that is perpendicular to the first horizontal direction hd1. As illustrated in FIG. 2A, the second lattice direction (e.g., major in-plane crystallographic direction) ld2 may be offset from the first horizontal direction hd1 (and from the second horizontal direction hd2) by a respective offset angle $a_2$, which may be at least 0.5 degree, or more preferably at least 1.0 degree.

In one embodiment, the second semiconductor wafer 20 may comprise a commercially available silicon wafer. In one embodiment, the second semiconductor wafer 20 may be a (100) silicon wafer, i.e., a single crystalline silicon wafer having a planar major surface including a (100) crystallographic plane so that a [100] crystallographic direction of the single crystalline material of the single crystalline silicon wafer is perpendicular to the physically exposed planar (100) crystallographic plane. In this embodiment, the (100) silicon wafer may include a [010] direction and a [001] direction selected from a pair of orthogonal in-plane horizontal directions, i.e., a pair of horizontal directions that are contained within the plane including the top surface of the silicon wafer. Alternatively, the (100) silicon wafer may include a [011] direction (which is a <110> direction) and a [0 1 -1] direction (which is another <110> direction) selected from a pair of orthogonal in-plane horizontal directions.

Alternatively, the second semiconductor wafer 20 may be a (110) silicon wafer, i.e., a single crystalline silicon wafer having a planar major surface including a (110) crystallographic plane so that a [110] crystallographic direction of the single crystalline material of the single crystalline silicon wafer is perpendicular to the physically exposed planar (110) crystallographic plane. In this embodiment, the (110) silicon wafer may include a [1-1 0] direction (which is one of <110> direction) and a direction selected from a pair of orthogonal in-plane horizontal directions. Alternatively, the (110) silicon wafer may include a [1-1 2] direction (which is one of <112> direction) and a [1-1 -1] direction (which is one of <111> directions) selected from a pair of orthogonal in-plane horizontal directions.

In a further alternative embodiment, the second semiconductor wafer 20 may be a (111) silicon wafer, i.e., a single crystalline silicon wafer having a planar major surface including a (111) crystallographic plane so that a [111] crystallographic direction of the single crystalline material of the single crystalline silicon wafer is perpendicular to the physically exposed planar (111) crystallographic plane. In this embodiment, the (111) silicon wafer may include a [1-1 0] direction (which is one of <110> directions) and a [1 1 -2] direction (which is one of <112> directions) selected from a pair of orthogonal in-plane horizontal directions.

Figure 2B:
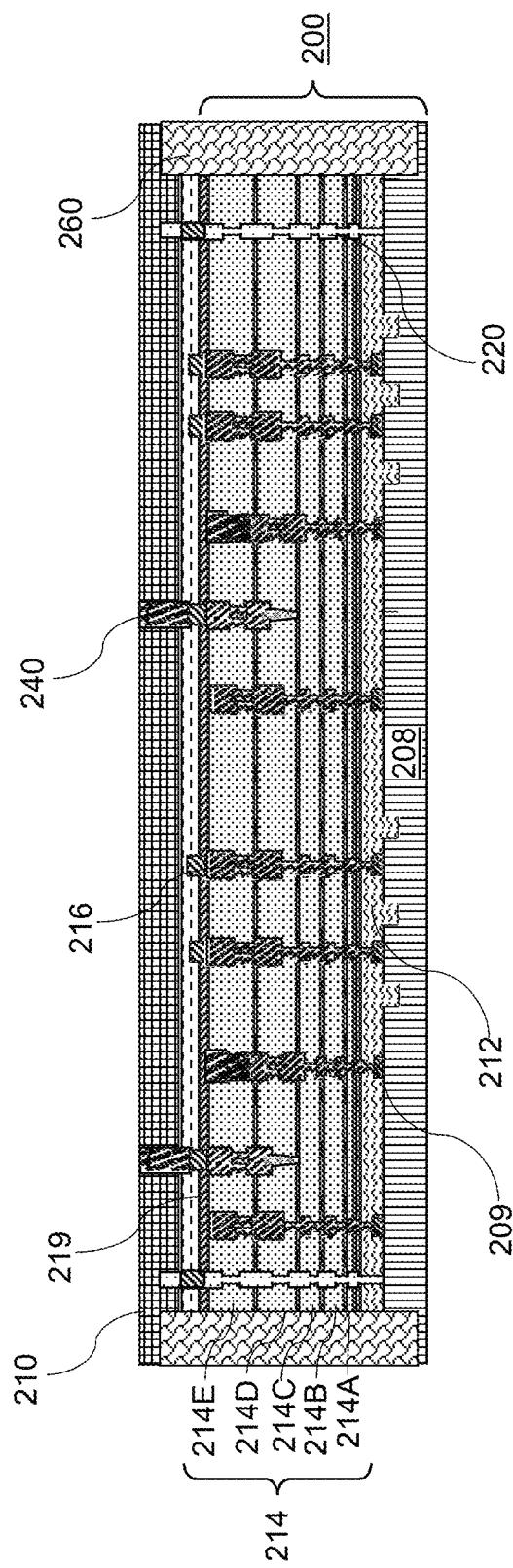
FIG. 2B is a vertical cross-sectional view of a second semiconductor die that may be included in a semiconductor package according to one or more embodiments.

FIG. 2B is a vertical cross-sectional view of a second semiconductor die 200 that may be included in a semiconductor package according to one or more embodiments. In some embodiments, the second semiconductor die 200 may include a second semiconductor substrate (e.g., silicon substrate) 208. An interlayer dielectric (ILD) 212 may be formed on the second substrate 208 and an intermetal dielectric (IMD) 214 may be formed on the interlayer dielectric 212. The interlayer dielectric 212 and intermetal dielectric 214 may include, for example, undoped silicon glass (USG), fluorosilicate glass (FSG), etc.

The intermetal dielectric 214 may include a plurality of IMD layers 214A-214E which may be separated by various etch stop and seal layers. The etch stop and seal layers may include, for example, SiC, SiN, etc. A passivation layer 219 may be formed over the intermetal dielectric 214. In some embodiments, the passivation layer 219 may include silicon oxide (e.g., $Si_xO_y$), silicon nitride ($Si_xN_y$), benzocyclobutene (BCB) polymer, polyimide (PI), polybenzoxazole (PBO) or a combination thereof. Other suitable dielectric materials are within the contemplated scope of disclosure. The passivation layer 219 may be formed by a suitable process such as spin coating, chemical vapor deposition (CVD), or the like.

Metal features 216 may be formed in the intermetal dielectric 214. The metal features 216 may include, for example, conductive vias and metal lines. The conductive vias may be formed between and in contact with the metal lines. The metal features 216 may be formed of copper, copper alloys, aluminum, aluminum alloys, or some combination thereof. Other suitable conductive metal materials for use as the metal features 216 are within the contemplated scope of disclosure. One or more gate electrodes 209 may be formed on the second substrate 208, and the metal features 216 may be electrically connected to the gate electrodes 209.

In some embodiments, one or more seal rings 220 may be formed in the intermetal dielectric 214. The seal rings 220 may be electrically isolated from the metal features 216 and formed so as to encircle a functional circuit region of the second semiconductor die 200. The seal rings 220 may provide protection for the features of the second semiconductor die 200 from water, chemicals, residue, and/or contaminants that may be present during the processing of the second semiconductor die 200. The seal rings 220 may be formed of a conductive material (e.g., metal material) and more particularly, may be formed of the same material, at the same time, and by the same process as the metal features 216. More particularly, the seal rings 220 may include conductive lines and via structures that are connected to each other, and may be formed simultaneously with the metal lines and conductive vias of the metal features 216. For example, the seal rings 220 may include copper at an atomic percentage greater than 80%, such as greater than 90% and/or greater than 95% although greater or lesser percentages may be used.

In some embodiments, the metal features 216 and/or the seal ring 220 may be formed by a dual-Damascene process or by multiple single Damascene processes. Single-Damascene processes generally form and fill a single feature with copper per Damascene stage. Dual-Damascene processes generally form and fill two features with a metal (e.g., copper) at once, e.g., a trench and overlapping through-hole may both be filled with a single copper deposition using dual-Damascene processes. In alternative embodiments, the metal features 216 and/or the seal ring 220 may be may be formed by an electroplating process.

For example, the Damascene processes may include patterning the intermetal dielectric 214 to form openings, such as trenches and/or though-holes (e.g., via holes). A deposition process may be performed to deposit a conductive metal (e.g., copper) in the openings. A planarization process, such as chemical-mechanical planarization (CMP) may then be performed to remove excess copper (e.g., overburden) that is disposed on top of the intermetal dielectric 214.

In particular, the patterning, metal deposition, and planarizing processes may be performed for each of the intermetal dielectric layers 214A-214E, in order to form an interconnect structure made up of the metal features 216 and/or the seal ring 220. For example, dielectric layer 214A may be deposited and patterned to form openings. A deposition process may then be performed to fill the openings in the dielectric layer 214A. A planarization process may then be performed to remove the overburden and form metal features 216 in the dielectric layer 214A. These process steps may be repeated to form the dielectric layers 214B-214E and the corresponding metal features 216 and/or seal ring 220, and thereby complete the interconnect structure and/or seal ring 220.

In some embodiments, the second semiconductor die 200 may include one or more conductive vias (not shown) that are connected to one or more of the metal features 216 and extend, for example, from the metal feature 216 through the intermetal dielectric 214, interlayer dielectric 212, and second substrate 208. These conductive via may include, for example, copper, gold, silver, aluminum or the like, or an alloy of these metals such as aluminum copper (AlCu) alloy. Other suitable materials for use in the conductive via are within the contemplated scope of disclosure.

A dielectric encapsulation layer 260 may be formed on the second semiconductor die 200 so as to encapsulate at least a portion of the second semiconductor die 200. The dielectric encapsulation layer 260 may include, for example, silicon dioxide. Alternatively, the dielectric encapsulation layer 260 may include undoped silicon glass (USG), fluorosilicate glass (FSG), SiC, SiON, SiN, SiCN, a low-K film, an extreme low-K (ELK) film, phosphor-silicate glass (PSG) and tetra-ethoxy-silane (TEOS). Other dielectric materials for use as the dielectric encapsulation layer are within the contemplated scope of disclosure.

A bonding layer 210 may be formed on the passivation layer 219. The bonding layer 210 may be used, for example, to bond the second semiconductor die 200 to another structure (e.g., another semiconductor die). The material and formation method of the bonding layer 210 may be similar to those of the ILD 212. One or more second conductive vias 240 may be formed in the bonding layer 210 and contact (e.g., directly or indirectly) a metal feature 216 in the second semiconductor die 200. The second conductive via 240 may be formed of the same material as the metal features 216 and/or other conductive vias in the second semiconductor die 200. In other embodiments, the second conductive via 240 may be formed of a different conductive material than the metal features 216 and/or other conductive vias.

Figure 3:
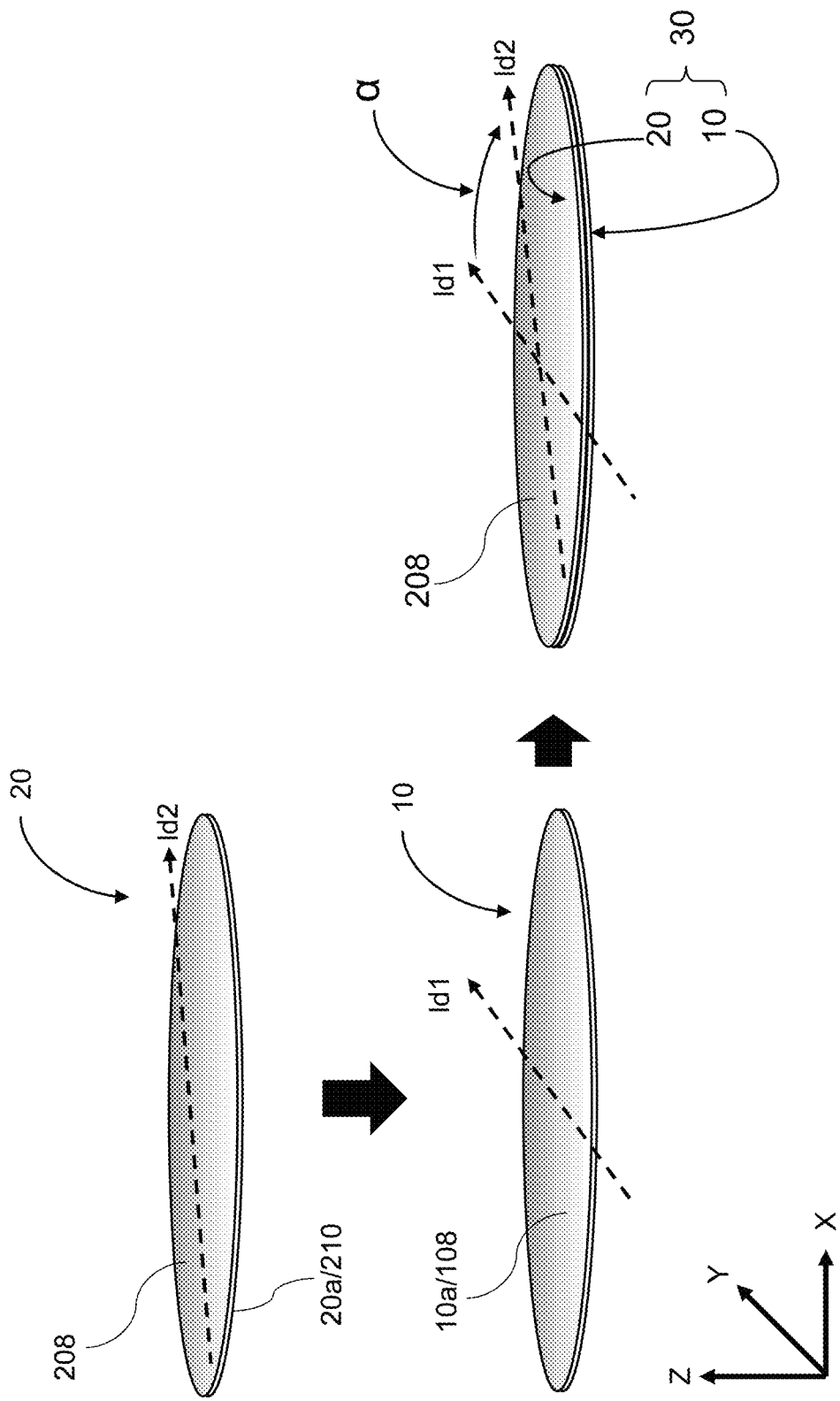
FIG. 3 illustrates a method of bonding the second semiconductor wafer on the first semiconductor wafer according to one or more embodiments.

FIG. 3 illustrates a method of bonding the second semiconductor wafer 20 on the first semiconductor wafer 10 according to one or more embodiments. In the method of FIG. 3, both the first semiconductor wafer 10 and the second semiconductor wafer 20 may be flipped (inverted) so that the first substrate 108 of the first semiconductor wafer 10 faces upward (the Z-direction in FIG. 3) and the substrate 208 of the second semiconductor wafer 20 also faces upward. Thus, a second bonding surface 20a of the second semiconductor wafer 20 (e.g., a surface of the bonding layer 210 of the second semiconductor dies 200) will be facing a first bonding surface 10a of the first semiconductor wafer 10 (e.g., a surface of the first substrate 108 of the first semiconductor die 100). Put another way, the upper surface of the second semiconductor wafer 20 may be bonded with the bottom surface of the first semiconductor wafer 10.

The plurality of second semiconductor dies 200 on the second semiconductor wafer 20 may be aligned (e.g., vertically aligned in a Z-direction in FIG. 3) with the plurality of first semiconductor dies 100 on the first semiconductor wafer 10, respectively. The second semiconductor wafer 20 may then be pressed onto the first semiconductor wafer 10 (e.g., and heat applied) such that the plurality of second semiconductor dies 200 contacts the plurality of first semiconductor dies 100 and becomes bonded to the plurality of first semiconductor dies 100 (i.e., via bonding layer 210). The second semiconductor wafer 20 may thereby be bonded to the first semiconductor wafer 10 to form a wafer stack 30 in which an angle $\alpha$ between the first lattice direction ld1 and the second lattice direction ld2 is greater than 0.5 degrees. The angle $\alpha$ may be given, for example, as the difference between the offset angle $a_2$ and offset angle $a_1$ (i.e., $\alpha = a_2 - a_1$). In particular, the second semiconductor wafer 20 may be bonded to the first semiconductor wafer 10 by a wafer-to-wafer (WtW) bond including a hybrid bond formed between the first bonding surface 10a of the first semiconductor wafer 10 and the second bonding surface 20a of the second semiconductor wafer 20. The hybrid bond may include, for example, a metal-to-metal bond and a non-metal-to-non-metal bond.

Figure 4:
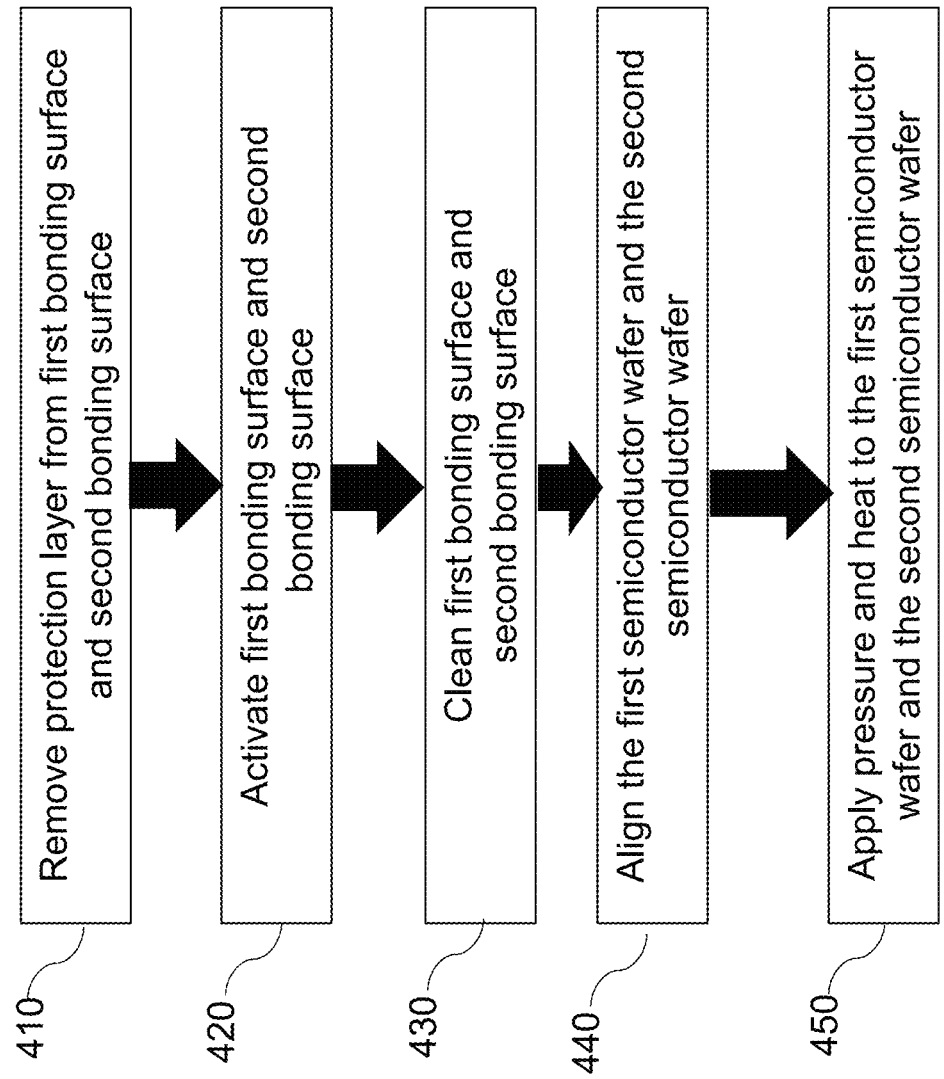
FIG. 4 is a process flow illustrating the process steps in a wafer-to-wafer (WtW) bonding process that may be used to form a wafer stack, according to one or more embodiments.

FIG. 4 provides a more detailed description of a WtW bonding process that may be used to form the wafer stack 30, according to one or more embodiments. For example, after the first semiconductor wafer 10 and second semiconductor wafer 20 have been prepared (e.g., after first array 15 has been formed on the first semiconductor wafer 10, and second array 25 has been formed on the second semiconductor wafer 20), a protection layer (not shown) may be formed on the first bonding surface 10a of the first semiconductor wafer 10 and on the second bonding surface 20a of the second semiconductor wafer 20.

The protection layer may be formed using a vapor type deposition process or a hydrophobic process having a contact angle of greater than about 60 degrees to the surface on which it is being applied (e.g., first bonding surface 10a, second bonding surface 20a). The protection layer may include a thickness of about 100 Angstroms or less and may include a monolayer of material.

The first semiconductor wafer 10 and second semiconductor wafer 20 may then be placed in a fabrication facility in storage or on a shelf for a period of time. During storage, the protection layer may inhibit the formation of an oxide layer (e.g., $Cu_2O$, $CuO$, $AlO_3$, etc.) on a surface of the first conductive via 150 in the first semiconductor die 100 of the first semiconductor wafer 10, and on a surface of the conductive via 240 in the second semiconductor die 200 of the second semiconductor wafer 20.

As illustrated in FIG. 4, a WtW bonding process may begin with a step 410 of removing the protection layer. In step 410, the protection layer may be removed by placing the first semiconductor wafer 10 and second semiconductive wafer 20 in a processing chamber, and exposing the first semiconductor wafer 10 and second semiconductive wafer 20 to an acid (e.g., HCOOH, HCl, etc.), and/or performing thermal decomposition, thermal desorption, plasma treatment, ultraviolet (UV) light treatment, or any combination thereof. During the removal of the protection layer in step 410, any oxide material that might have formed on the conductive surfaces (e.g., surface of the first conductive via 150 in the first semiconductor die 100 of the first semiconductor wafer 10, and on a surface of the second conductive via 240 in the second semiconductor die 200 of the second semiconductor wafer 20), may also be removed.

In step 420, the first bonding surface 10a and the second bonding surface 20a may be activated using an activation process that may include, for example, performing plasma treatment at a power density of less than about 1,000 Watts. A surface roughness of the first bonding surface 10a and second bonding surface 20a is not substantially altered by the activation process, and may comprise a root mean square (RMS) of less than about 5 Angstroms.

In step 430, the first bonding surface 10a and the second bonding surface 20a may be cleaned in a cleaning process. The cleaning process may be performed, for example, by exposing the first bonding surface 10a and the second bonding surface 20a to deionized (DI) $H_2O$, $NH_4OH$, diluted hydrofluoric acid (DHF) (e.g., at a concentration of less than about 1% HF acid), or other acids or other cleaning solutions. The cleaning process may also use a brushing procedure, a mega-sonic procedure, a spin process, exposure to an infrared (IR) lamp, or a combination thereof. The cleaning process may enhance a density of a hydroxy group disposed on the first conductive via 150 of first bonding surface 10a and the second conductive via 240 of the second bonding surface 20a. Enhancing the density of the hydroxy groups may increase a bonding strength and reduce the anneal temperature required for the hybrid bonding process.

Steps 410-430 (e.g., the removal process, activation process, and cleaning process) may be performed continuously without removing the first semiconductor wafer 10 and the second semiconductor wafer 20 from the chamber to avoid forming any additional oxide material on the first conductive via 150 and second conductive via 240. Steps 410-430 are intended to prepare the first bonding surface 10a and second bonding surface 20a for hybrid bonding so that a high-quality hybrid bond may be formed between the first semiconductor wafer 10 and the second semiconductor wafer 20. The steps 410-430 may allow the use of lower pressures and temperatures in a subsequent hybrid bonding process.

In step 440, the first semiconductor wafer 10 may be aligned with the second semiconductor wafer 20. The second semiconductor wafer 20 may be placed over the first semiconductor wafer 10 so that the second bonding surface 20a may be facing in the Z-direction the first bonding surface 10a (e.g., see FIG. 3). Then, the first array 15 of first semiconductor dies 100 on the first semiconductor wafer 10 may be aligned with the second array 25 of the second semiconductor dies 200 on the second semiconductor wafer 20, so that the first conductive vias 150 in the first array 15 may be aligned with (e.g., facing in the Z-direction) the second conductive vias 240 in the second array 25. The alignment of the first semiconductor wafer 10 with the second semiconductor wafer 20 may be achieved, for example, using optical sensing. Other features of the first bonding surface 10a and the second bonding surface 20a may also be identified and aligned (e.g., by optical sensing) during the alignment process in step 440.

In step 450, the first semiconductor wafer 10 and second semiconductor wafer 20 may be hybrid bonded together in a hybrid bonding process (e.g., in the same process chamber used in steps 410-430) by applying pressure and heat to the first semiconductor wafer 10 and second semiconductor wafer 20. That is, the first semiconductor wafer 10 and second semiconductor wafer 20 may be pressed together (e.g., as illustrated in FIG. 3) simultaneously with the application of heat. The pressure applied may include, for example, a pressure of less than about 30 MPa, and the heat applied may include an annealing heat at a temperature of about 100° C. to 500° C. The annealing heat may cause the copper in the first conductive vias 150 and second conductive vias 240 to have a grain size in a range of about 0.1 μm to 5 μm and a bond strength greater than about 1.0 J/m². The hybrid bonding process of Step 450 may be performed, for example, in a nitrogen ($N_2$) environment, an argon (Ar) environment, a helium (He) environment, or another inert gas environment, to ensure that the chamber contains little or no ambient oxygen that may cause oxidation of the first conductive vias 150 and second conductive vias 240 before or during the hybrid bonding process of step 450. The hybrid bonding process of step 450 may result in a metal-to-metal bond (e.g., copper-to-copper bond) that is formed between metal features, and a fusion bond (e.g., non-metal-to-non-metal bond) being formed between non-metal features (e.g., dielectric layers, semiconductor layers, etc.).

Figure 5:
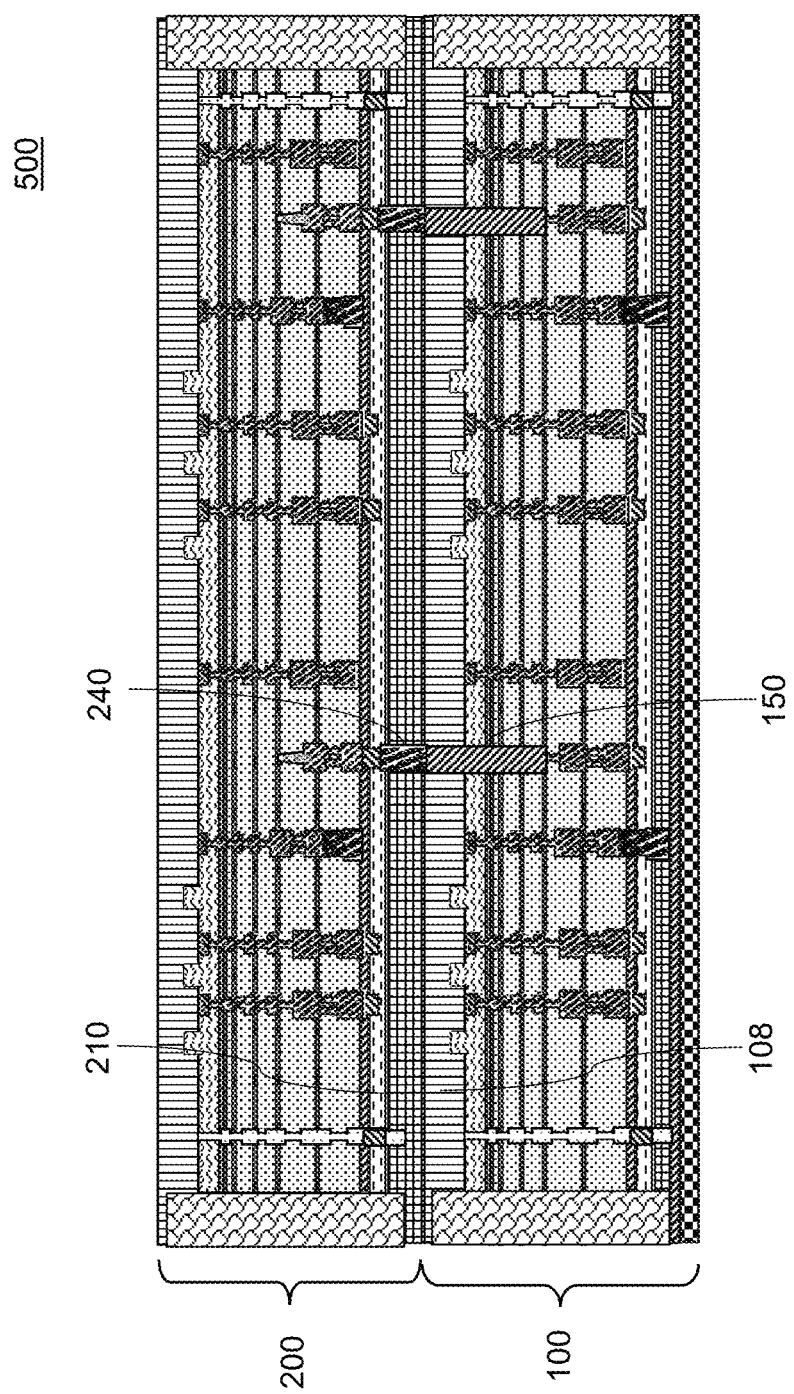
FIG. 5 is a vertical cross-sectional view of a semiconductor die stack that may be formed by the WtW bonding process described above and illustrated in FIG. 4, according to one or more embodiments.

FIG. 5 illustrates a semiconductor die stack 500 that may be formed by the WtW bonding process described above and illustrated in FIG. 4, according to one or more embodiments. That is, the WtW bonding process causes the first semiconductor dies 100 in first array 15 to be hybrid bonded to the second semiconductor dies 200 in second array 25, to form an array of stacked semiconductor devices 500 in the wafer stack 30 (e.g., see FIG. 3). In particular, the hybrid bonding process of step 450 may result in a e.g., metal-to-metal bond (e.g., copper-to-copper bond) that is formed between the first conductive vias 150 and second conductive vias 240. The hybrid bonding process of step 450 may also result in a fusion bond (e.g., non-metal-to-non-metal bond) being formed between the substrate 108 (e.g., in the first semiconductor wafer 10) and the bonding layer 210 (e.g., in the second semiconductor wafer 20).

The result is a plurality of semiconductor die stacks 500 formed within the wafer stack 30. The wafer stack 30 may then sawed along scribe lines that are arranged in a grid shape in a top view, so as to separate the individual semiconductor dies stacks 500 from the wafer stack 30.

Figure 6:
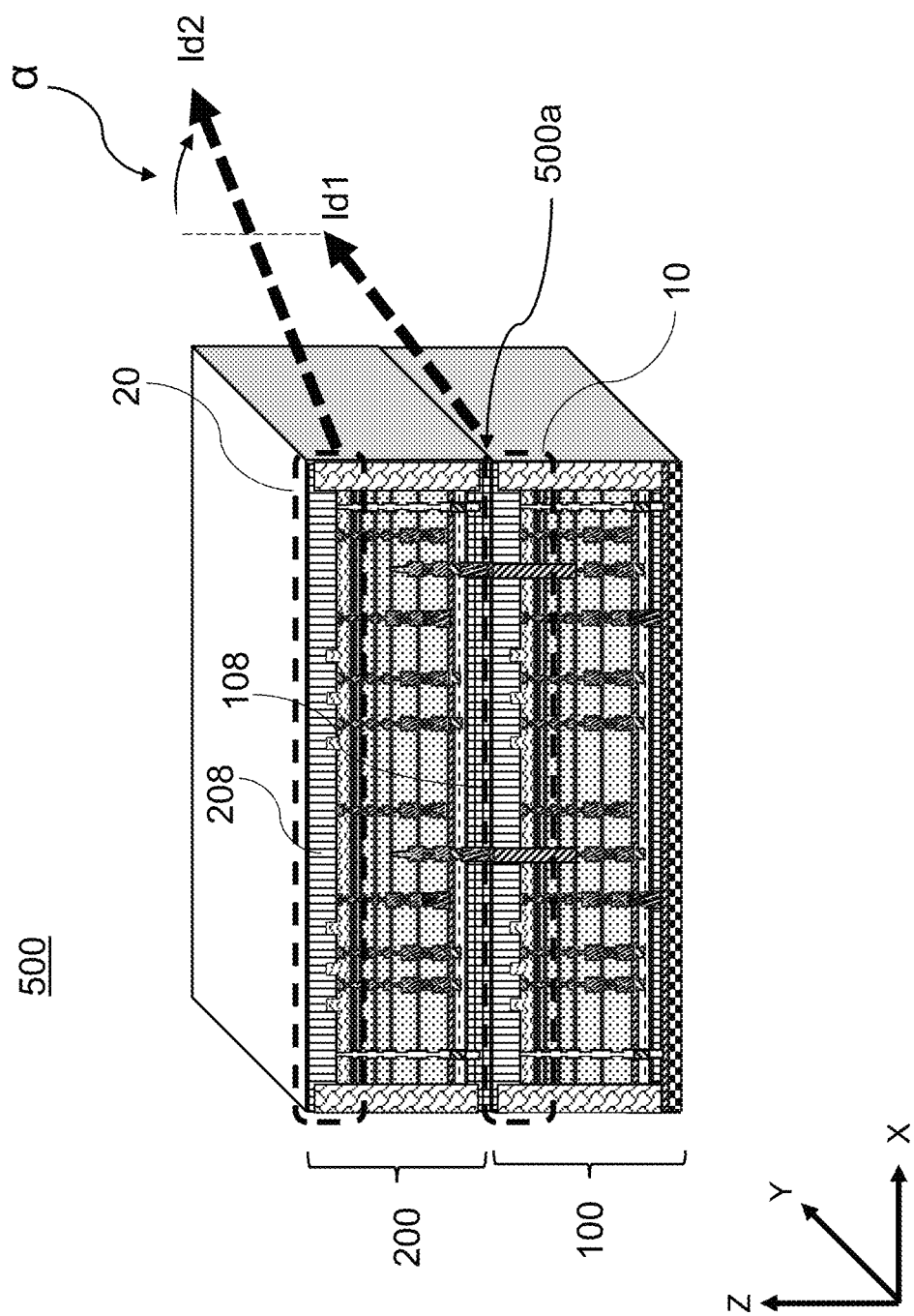
FIG. 6 is a perspective view of the semiconductor die stack according to one or more embodiments.

FIG. 6 further illustrates the semiconductor die stack 500 according to one or more embodiments. As illustrated in FIG. 6, the second semiconductor die 200 may be bonded to the first semiconductor die 100 at the wafer-to-wafer (WtW) interface 500a.

Since the first substrate 108 of the first semiconductor die 100 may be formed of the first semiconductor wafer 10, the first semiconductor die 100 may have the first lattice direction ld1 of the first semiconductor wafer 10. Similarly, since the second substrate 208 of the second semiconductor die 200 may be formed of the second semiconductor wafer 20, the second semiconductor die 200 may have the second lattice direction ld2 of the second semiconductor wafer 20. Thus, the angle α between the first lattice direction ld1 in the first semiconductor die 100 and the second lattice direction ld2 in the second semiconductor die 200 may be the same as the angle α between the first lattice direction ld1 in the first semiconductor wafer 10 and the second lattice direction ld2 in the second semiconductor wafer 20. That is, the angle a between the first lattice direction ld1 in the first semiconductor die 100 and the second lattice direction ld2 in the second semiconductor die 200 may be greater than 0.5 degrees. More preferably, the angle α may be greater than 1 degree, still more preferably the angle may be greater than 5 degrees, still more preferably the angle may be greater than 10 degrees, and still more preferably the angle may be 45 degrees.

Figure 7A:
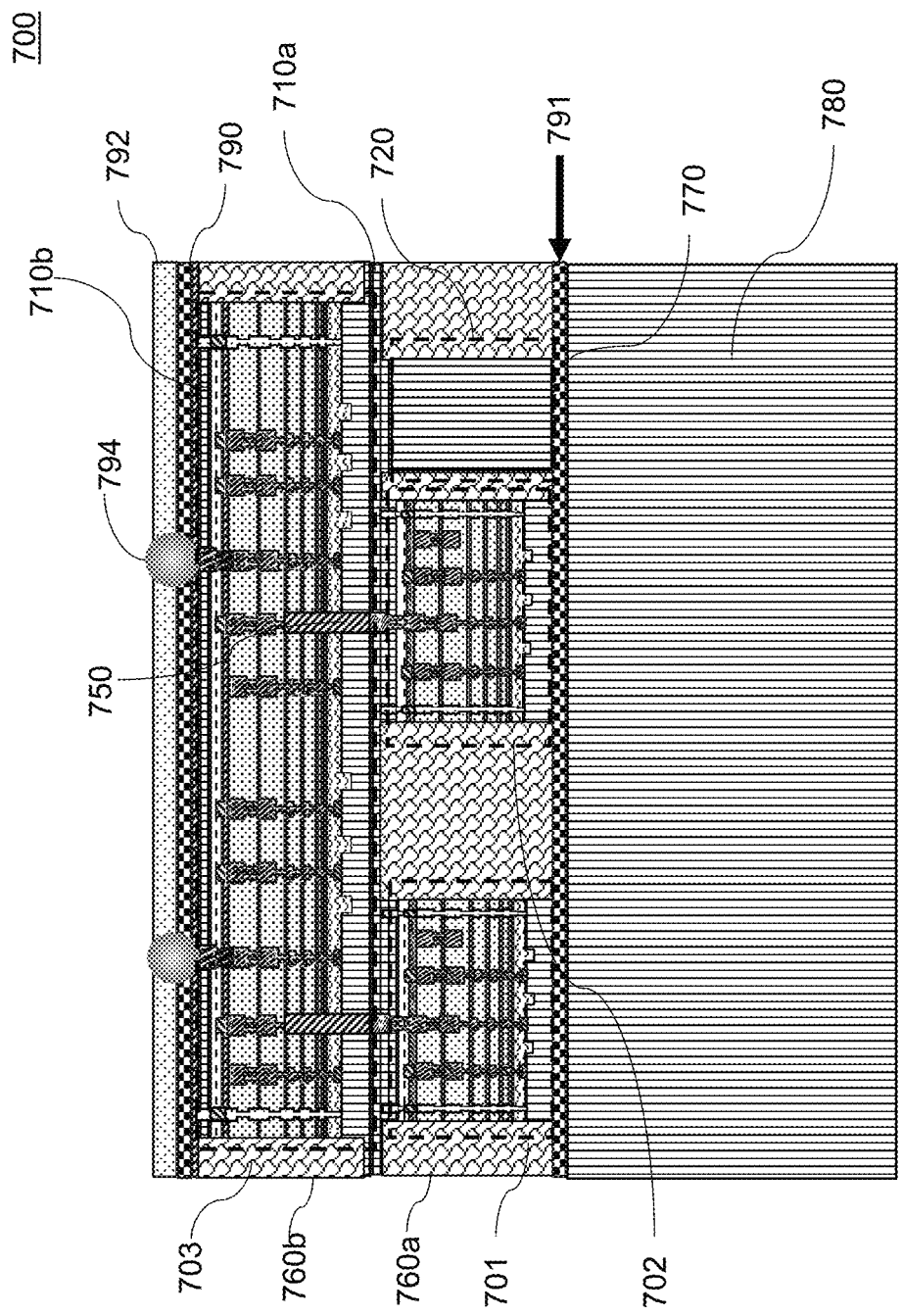
FIG. 7A is a vertical cross-sectional view of a semiconductor die stack according to one or more embodiments.

FIG. 7A is a vertical cross-sectional view of a semiconductor die stack 700 according to one or more embodiments. The semiconductor die stack 700 may include, for example, a System of Integrated Circuits (SoIC) device. The semiconductor die stack 700 may include a semiconductor wafer 780 (e.g., a portion of a semiconductor wafer formed by dicing the semiconductor wafer). The semiconductor wafer 780 may include, for example, a carry wafer. The semiconductor die stack 700 may also include a first semiconductor die 701, a second semiconductor die 702 and a dummy die 720 that are bonded to the semiconductor wafer 780 by a bonding film 770 at an interface 791. Interface 791 may be a die-die interface or a wafer-to-wafer interface. The dummy die 720 may include, for example, a silicon dummy die. The first semiconductor die 701 and the second semiconductor die 702 may have the same structure, as illustrated in FIG. 7A, or may have a different structure. A first dielectric encapsulation layer 760a may be formed so as to at least partially encapsulate the first semiconductor die 701, the second semiconductor die 702 and the dummy die 720.

The semiconductor die stack 700 may also include a third semiconductor die 703 that may be bonded on the first semiconductor die 701, the second semiconductor die 702 and the dummy die 720. A second dielectric encapsulation layer 760b may be formed so as to at least partially encapsulate the third semiconductor die 703.

A fusion bonding film 790 may be formed on the third semiconductor die 703 and the second dielectric encapsulation layer 760b, and a molding material layer 792 may be formed on the fusion bonding film 790. The semiconductor die stack 700 may also include one or more solder balls 794 formed in the fusion bonding film 790 and molding material layer 792, in order to provide an electrical connection to the third semiconductor die 703.

The third semiconductor die 703 may have a structure that is the same as the first semiconductor die 100 that is described above and illustrated in FIG. 1B. As noted above, the first semiconductor die 701 and the second semiconductor die 702 may have the same structure as illustrated in FIG. 7A.

Figure 7B:
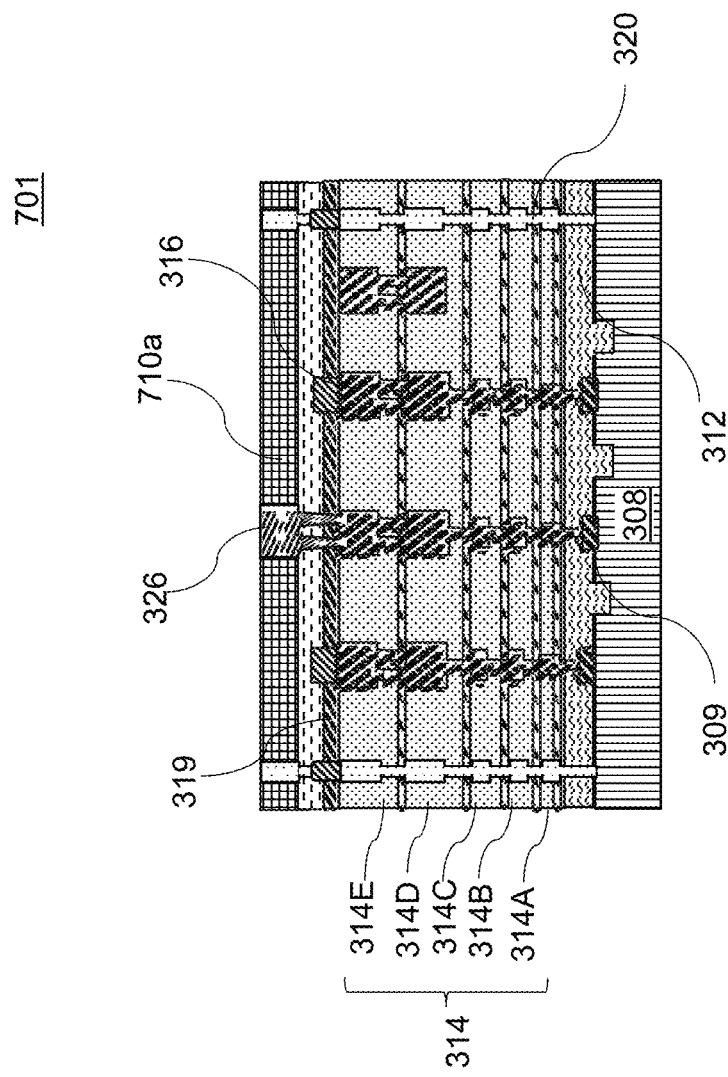
FIG. 7B is a vertical cross-sectional view of the first semiconductor die according to one or more embodiments.

FIG. 7B is a vertical cross-sectional view of the first semiconductor die 701 according to one or more embodiments. As illustrated in FIG. 7B, the first semiconductor die 701 may include a semiconductor substrate (e.g., silicon substrate) 308 that may be formed from a silicon wafer. An interlayer dielectric (ILD) 312 may be formed on the semiconductor substrate 308 and an intermetal dielectric (IMD) 314 may be formed on the interlayer dielectric 312. The interlayer dielectric 312 and intermetal dielectric 314 may include, for example, undoped silicon glass (USG), fluorosilicate glass (FSG), etc.

The intermetal dielectric 314 may include a plurality of IMD layers 314A-314E which may be separated by various etch stop and seal layers. The etch stop and seal layers may include, for example, SiC, SiN, etc. A passivation layer 319 may be formed over the intermetal dielectric 314. In some embodiments, the passivation layer 319 may include silicon oxide (e.g., $Si_xO_y$), silicon nitride ($Si_xN_y$), benzocyclobutene (BCB) polymer, polyimide (PI), polybenzoxazole (PBO) or a combination thereof. Other suitable dielectric materials are within the contemplated scope of disclosure. The passivation layer 319 may be formed by a suitable process such as spin coating, chemical vapor deposition (CVD), or the like.

Metal features 316 may be formed in the intermetal dielectric 314. The metal features 316 may include, for example, conductive vias and metal lines. The conductive vias may be formed between and in contact with the metal lines. The metal features 316 may be formed of copper, copper alloys, aluminum, aluminum alloys, or some combination thereof. Other suitable conductive metal materials for use as the metal features 316 are within the contemplated scope of disclosure. One or more gate electrodes 309 may be formed on the semiconductor substrate 308, and the metal features 316 may be electrically connected to the gate electrodes 309.

In some embodiments, one or more seal rings 320 may be formed in the intermetal dielectric 314. The seal rings 320 may be electrically isolated from the metal features 316 and formed so as to encircle a functional circuit region of the first semiconductor die 701. The seal rings 320 may provide protection for the features of the first semiconductor die 701 from water, chemicals, residue, and/or contaminants that may be present during the processing of the first semiconductor die 701. The seal rings 320 may be formed of a conductive material (e.g., metal material) and more particularly, may be formed of the same material, at the same time, and by the same process as the metal features 316. More particularly, the seal rings 320 may include conductive lines and via structures that are connected to each other, and may be formed simultaneously with the metal lines and conductive vias of the metal features 316. For example, the seal rings 320 may include copper at an atomic percentage greater than 80%, such as greater than 90% and/or greater than 95% although greater or lesser percentages may be used.

In some embodiments, the metal features 316 and/or the seal ring 320 may be formed by a dual-Damascene process or by multiple single Damascene processes. Single-Damascene processes generally form and fill a single feature with copper per Damascene stage. Dual-Damascene processes generally form and fill two features with a metal (e.g., copper) at once, e.g., a trench and overlapping through-hole may both be filled with a single copper deposition using dual-Damascene processes. In alternative embodiments, the metal features 316 and/or the seal ring 320 may be may be formed by an electroplating process.

For example, the Damascene processes may include patterning the intermetal dielectric 314 to form openings, such as trenches and/or though-holes (e.g., via holes). A deposition process may be performed to deposit a conductive metal (e.g., copper) in the openings. A planarization process, such as chemical-mechanical planarization (CMP) may then be performed to remove excess copper (e.g., overburden) that is disposed on top of the intermetal dielectric 314.

In particular, the patterning, metal deposition, and planarizing processes may be performed for each of the intermetal dielectric layers 314A-314E, in order to form an interconnect structure made up of the metal features 316 and/or the seal ring 320. For example, dielectric layer 314A may be deposited and patterned to form openings. A deposition process may then be performed to fill the openings in the dielectric layer 314A. A planarization process may then be performed to remove the overburden and form metal features 316 in the dielectric layer 314A. These process steps may be repeated to form the dielectric layers 314B-314E and the corresponding metal features 316 and/or seal ring 320, and thereby complete the interconnect structure and/or seal ring 320.

A first bonding layer 710a may be formed on the passivation layer 319. The first bonding layer 710a may be used, for example, to bond the first semiconductor die 701 to another structure (e.g., another semiconductor die). The material and formation method of the first bonding layer 710a may be similar to those of the ILD 312. One or more bonding pads 326 or conductive vias (not shown) may be formed in the first bonding layer 710a and contact (e.g., directly or indirectly) a metal feature 316 in the first semiconductor die 701. The bonding pads 326 or conductive vias may be formed of the same material as the metal features 316. In other embodiments, the bonding pads 326 and conductive vias may be formed of a different conductive material than the metal features 316.

Referring again to FIG. 7A, a method of forming the semiconductor die stack 700 may begin by forming the bonding film 770 on the semiconductor wafer 780. The bonding film 770 may include, for example, a fusion bonding film and may include silicon oxynitride or silicon dioxide. The first semiconductor die 701, the second semiconductor die 702 and the dummy die 720 may then be mounted on the semiconductor wafer 780 as illustrated in FIG. 7A.

The first dielectric encapsulation layer 760a may then be deposited so as to at least partially encapsulate the first semiconductor die 701, second semiconductor die 702 and dummy die 720. The first dielectric encapsulation layer 760a may include, for example, silicon dioxide. Alternatively, the dielectric encapsulation layer 760a may include undoped silicon glass (USG), fluorosilicate glass (FSG), SiC, SiON, SiN, SiCN, a low-K film, an extreme low-K (ELK) film, phosphor-silicate glass (PSG) and tetra-ethoxy-silane (TEOS). Other dielectric materials for use as the dielectric encapsulation layer are within the contemplated scope of disclosure.

The first bonding layer 710a may then be formed on the first semiconductor die 701, the second semiconductor die 702, the dummy die 720, and the first dielectric encapsulation layer 760a. The first bonding layer 710a may include, for example, a hybrid bonding film and may include silicon dioxide.

The third semiconductor die 703 may then be mounted on the first bonding layer 710a so that the through silicon vias 750 in the third semiconductor die 703 contact the bonding pads 326 in the first semiconductor die 701 and the second semiconductor die 702. The second dielectric encapsulation layer 760b may then be deposited so as to at least partially encapsulate the third semiconductor die 703. The second dielectric encapsulation layer 760b may be formed in the same manner and of the same materials as the first dielectric encapsulation layer 760a.

A second bonding layer 710b may then be formed on the third semiconductor die 703. The second bonding layer 710b may be formed in the same manner and of the same materials as the first bonding layer 710a. The fusion bonding film 790 may then be formed through the second bonding layer 710b on the third semiconductor die 703 and the second dielectric encapsulation layer 760b. The fusion bonding film 790 may include, for example, silicon oxynitride or silicon dioxide. The molding material layer 792 may then be formed on the fusion bonding film 790. The molding material layer 792 may include, for example, an organic polymer. The one or more solder balls 794 may then be formed in the fusion bonding film 790 and molding material layer 792 so as to contact the third semiconductor die 703.

A plurality of the semiconductor die stacks 700 may be formed in an array on the semiconductor wafer 780. After the semiconductor die stacks 700 have been formed, the semiconductor wafer 780 may be diced apart in order to separate the semiconductor die stacks 700 into individual stacks. The separated semiconductor die stacks 700 may then be flipped and mounted, for example, onto a packaging substrate.

Figure 8A:
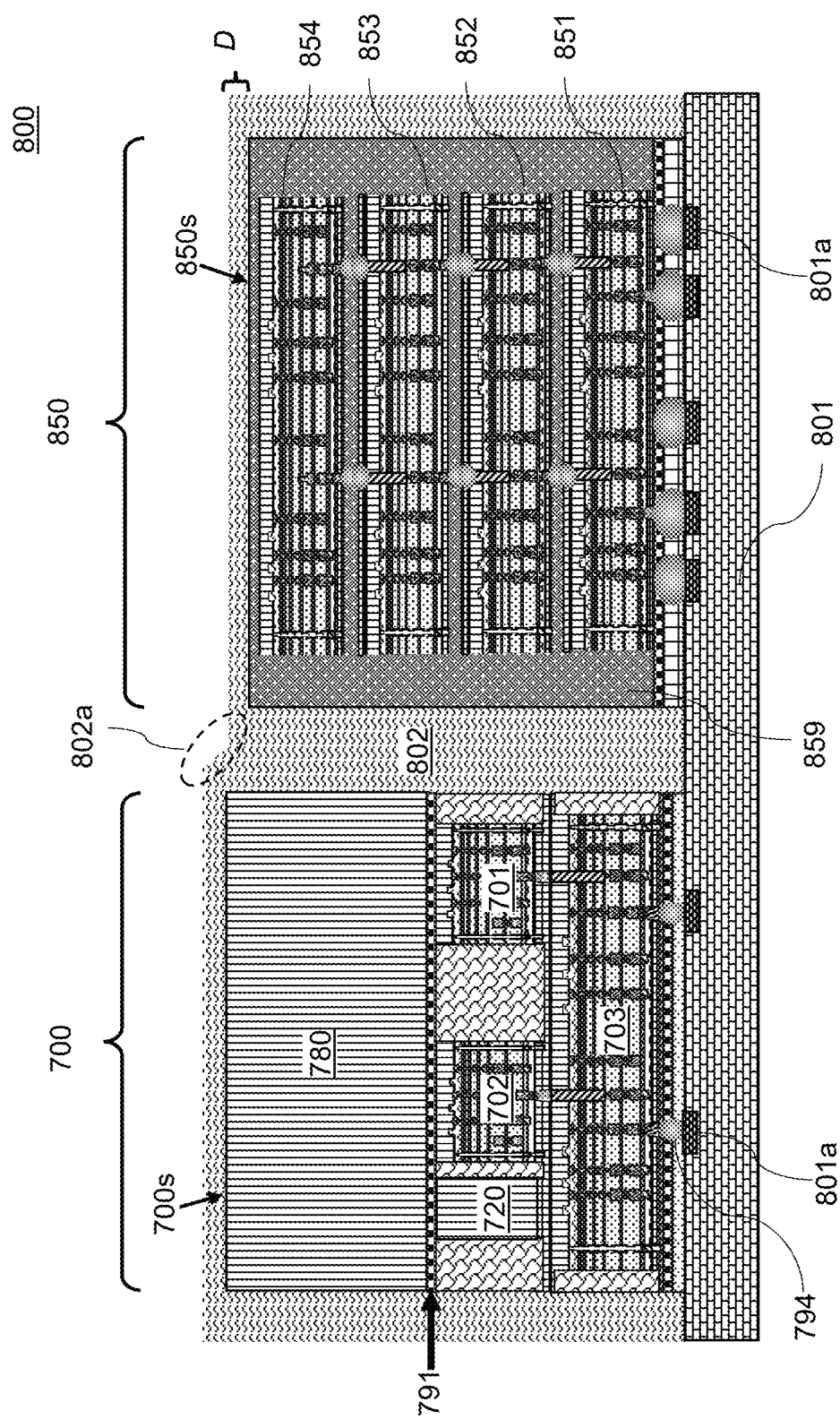
FIG. 8A is a vertical cross-sectional view of a semiconductor package according to one or more embodiments.

FIG. 8A illustrates a semiconductor package 800 according to one or more embodiments. As illustrated in FIG. 8A, the semiconductor package 800 may include the semiconductor die stack 700 mounted on a substrate 801 such as a packaging substrate. As noted above, the semiconductor die stack 700 includes the first semiconductor die 701, the second semiconductor die 702, the dummy die 720, the third semiconductor die 703 and the semiconductor wafer 780. The substrate 801 may include bonding pads (e.g., metal bonding pads) formed in an upper surface of the substrate 801. The solder balls 794 of the semiconductor die stack 700 may be bonded onto the bonding pads 801a so that the semiconductor die stack 700 may be electrically connected to the substrate 801 and may be electrically connected to other die groups that are also mounted on the substrate 801.

The semiconductor package 800 may also include a first adjacent die group 850 that may be mounted on the substrate 801. A distance between the semiconductor die stack 700 and the first adjacent die group 850 may be greater than about 30 μm to allow a pick-and-place process to be performed on the substrate 801. The first adjacent die group 850 may include, for example, a high bandwidth memory (HBM) die that includes a plurality of stacked semiconductor dies 851, 852, 853, 854 and a molding material (e.g., organic polymer molding material) 859 formed around the stacked semiconductor dies 851, 852, 853, 854. The semiconductor package 800 may also include an outer molding material layer 802 that may be formed over the semiconductor die stack 700 and the first adjacent die group 850. The outer molding material layer 802 may also include an organic polymer.

The semiconductor package 800 may include at least two design features for reducing a stress at the interface 791 in the semiconductor die stack 700. First, the semiconductor die stack 700 itself may include a lattice shift that may reduce the stress at the interface 791. Secondly, a height difference between the semiconductor die stack 700 and the first adjacent die group 850 may be set so as to reduce a stress on the interface 791 in the semiconductor die stack 700.

Figure 8C:
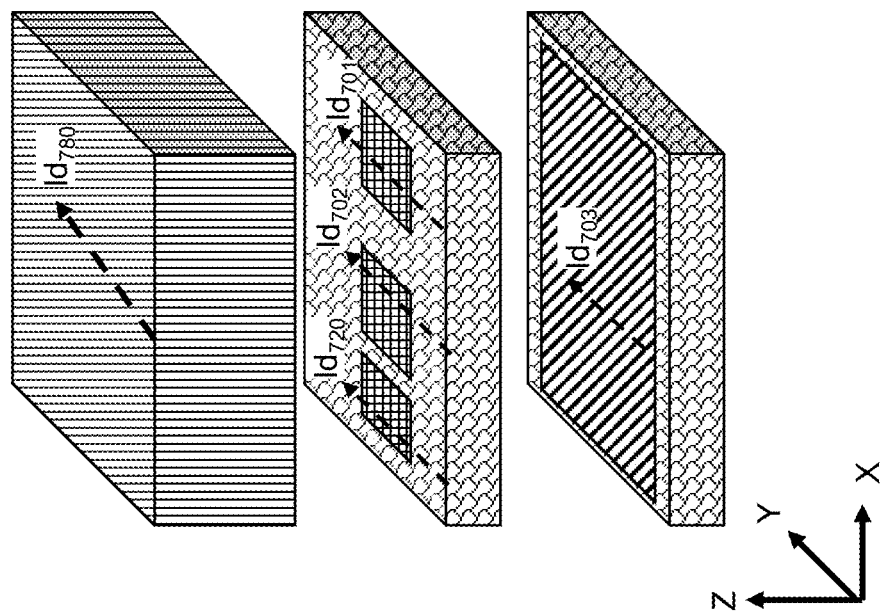
FIG. 8C illustrates an exploded view of the semiconductor die stack according to one or more embodiments.
Figure 8B:
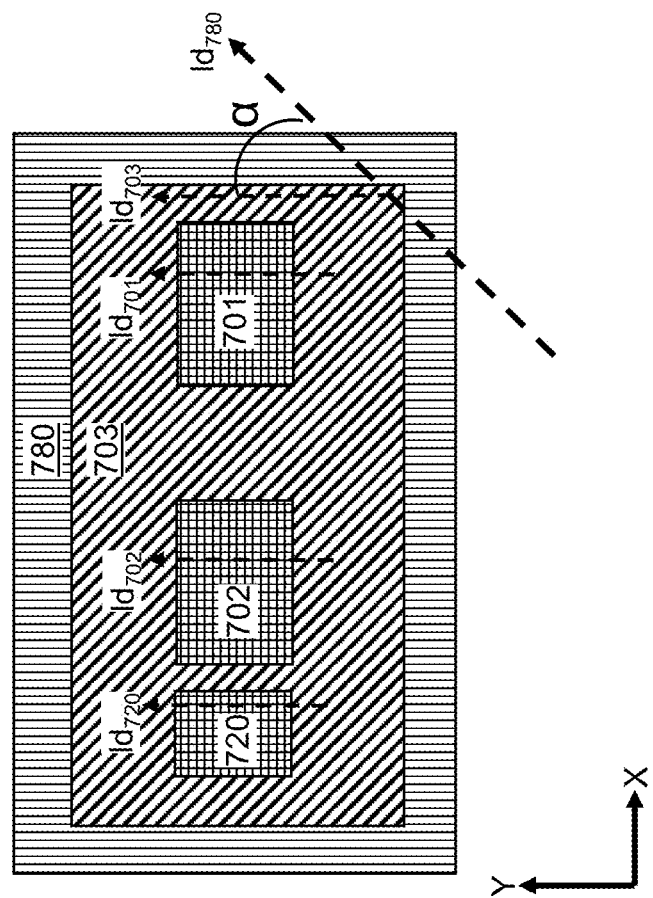
FIG. 8B illustrates a top view of the semiconductor die stack according to one or more embodiments.

FIGS. 8B and 8C illustrate an example of a lattice shift in the semiconductor die stack 700 according to one or more embodiments. FIG. 8B illustrates a top view of the semiconductor die stack 700 according to one or more embodiments. FIG. 8C illustrates an exploded view of the semiconductor die stack 700 according to one or more embodiments.

In particular, FIGS. 8B and 8C illustrate an example of the semiconductor die stack 700 in which the first lattice direction of the first semiconductor die 701 (ld701), the second lattice direction of the second semiconductor die 702 (ld702), the dummy lattice direction of the dummy die 720 (ld720), and the third lattice direction of the third semiconductor die 703 (ld703) are all directed in the Y-direction, and where the wafer lattice direction of the semiconductor wafer 780 (ld780) may be offset from the other lattice directions (e.g., ld701, ld702, ld720, ld703) in the X-direction by an angle α that is at least 0.5 degrees. More preferably, the angle may be greater than 1 degree, still more preferably the angle may be greater than 5 degrees, still more preferably the angle may be greater than 10 degrees, and still more preferably the angle may be 45 degrees.

Figure 8D:
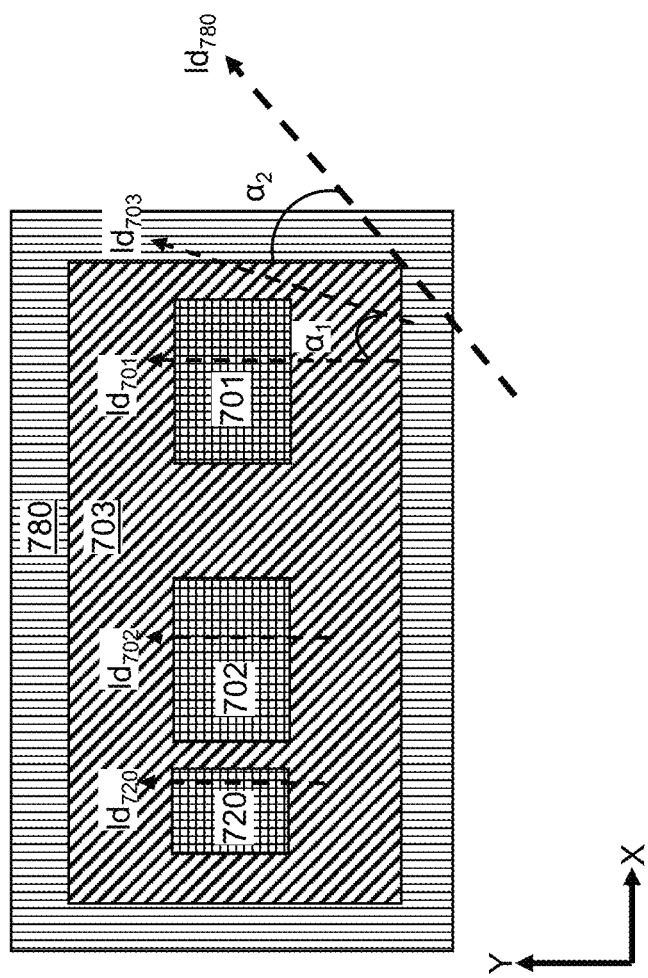
FIG. 8D illustrates a top view of the semiconductor die stack with another example of a lattice shift according to one or more embodiments.

FIG. 8D illustrates another example of a lattice shift in the semiconductor die stack 700 according to one or more embodiments. In contrast to the example in FIG. 8B, in the example of FIG. 8D, the third lattice direction of the third semiconductor die 703 (ld703) may be offset from the lattice directions of ld701, ld702 and ld720 in the X-direction by an angle $\alpha_1$ that is at least 0.5 degrees, and the wafer lattice direction of the semiconductor wafer 780 (ld780) may be offset from the other lattice directions (e.g., ld701, ld702, ld720, ld703) in the X-direction by an angle $\alpha_2$ that is at least 0.5 degrees. The angles $\alpha_1$ and $\alpha_2$ may be more preferably greater than 1 degree, still more preferably the angles may be greater than 5 degrees, still more preferably the angles may be greater than 10 degrees, and still more preferably the angles may be 45 degrees.

It should be noted that the lattice directions ld701, ld702, ld720, and ld703 are merely illustrative and are not intended to be limiting. That is, the lattice directions ld701, ld702, ld720, and 1d703 may all be different from each other and may be in a direction other than in the Y-direction. In that case, the wafer lattice direction of the semiconductor wafer 780 (ld780) may be offset from all of the different lattice directions (e.g., ld701, ld702, ld720, ld703) in the X-direction by an angle α that is at least 0.5 degrees, and more preferably greater than 1 degree, still more preferably the angle may be greater than 5 degrees, still more preferably the angle may be greater than 10 degrees, and still more preferably the angle may be 45 degrees.

Referring again to FIG. 8A, a second design feature of the semiconductor package 800 that may reduce a stress on the bond at the interface 791 in the semiconductor die stack 700 is that a height difference D between the semiconductor die stack 700 and the first adjacent die group 850 may be set so as to reduce a stress on the bond at the interface 791 in the semiconductor die stack 700. The height difference D may be measured, for example, from the uppermost surface 850s of the first adjacent die group 850 (e.g., the uppermost surface of the molding material 859) to the uppermost surface of the semiconductor die stack 700 (e.g., the uppermost surface of the semiconductor wafer 780).

It may be preferable that the height of the first adjacent die group 850 is equal to a height of the semiconductor die stack 700. That is, it may be preferable that there is no difference (D=0) between the height of the first adjacent die group 850 and a height of the semiconductor die stack 700. However, if the height of the first adjacent die group 850 is not equal to a height of the semiconductor die stack 700, then the height difference D may be no greater than 10% of the height of the semiconductor die stack 700. Thus, for example, if a height of the semiconductor die stack 700 is 500 μm (e.g., assuming that a height of first semiconductor die 701 and second semiconductor die 702 may be 15 μm, a height of third semiconductor die 701 is 15 μm, and a height of the semiconductor wafer 780 is 470 μm), then a height of the first adjacent die group 850 may be in a range from 450 μm to 550 μm.

As illustrated in FIG. 8A, by limiting the height difference D to be within 10% of the height of the semiconductor die stack 700, an unevenness 802a in a surface of the outer molding material layer 802 may be limited to a moderate amount of unevenness, and therefore an uneven stress distribution caused by the outer molding material layer 802 may be limited. That is, by limiting the height difference D to be within 10% of the height of the semiconductor die stack 700, any stress caused by the outer molding material layer 802 may be approximately evenly divided between the semiconductor die stack 700 and the first adjacent die group 850, so that a stress applied on the bond at the interface 791 in semiconductor die stack 700 may be reduced.

Figure 9A:
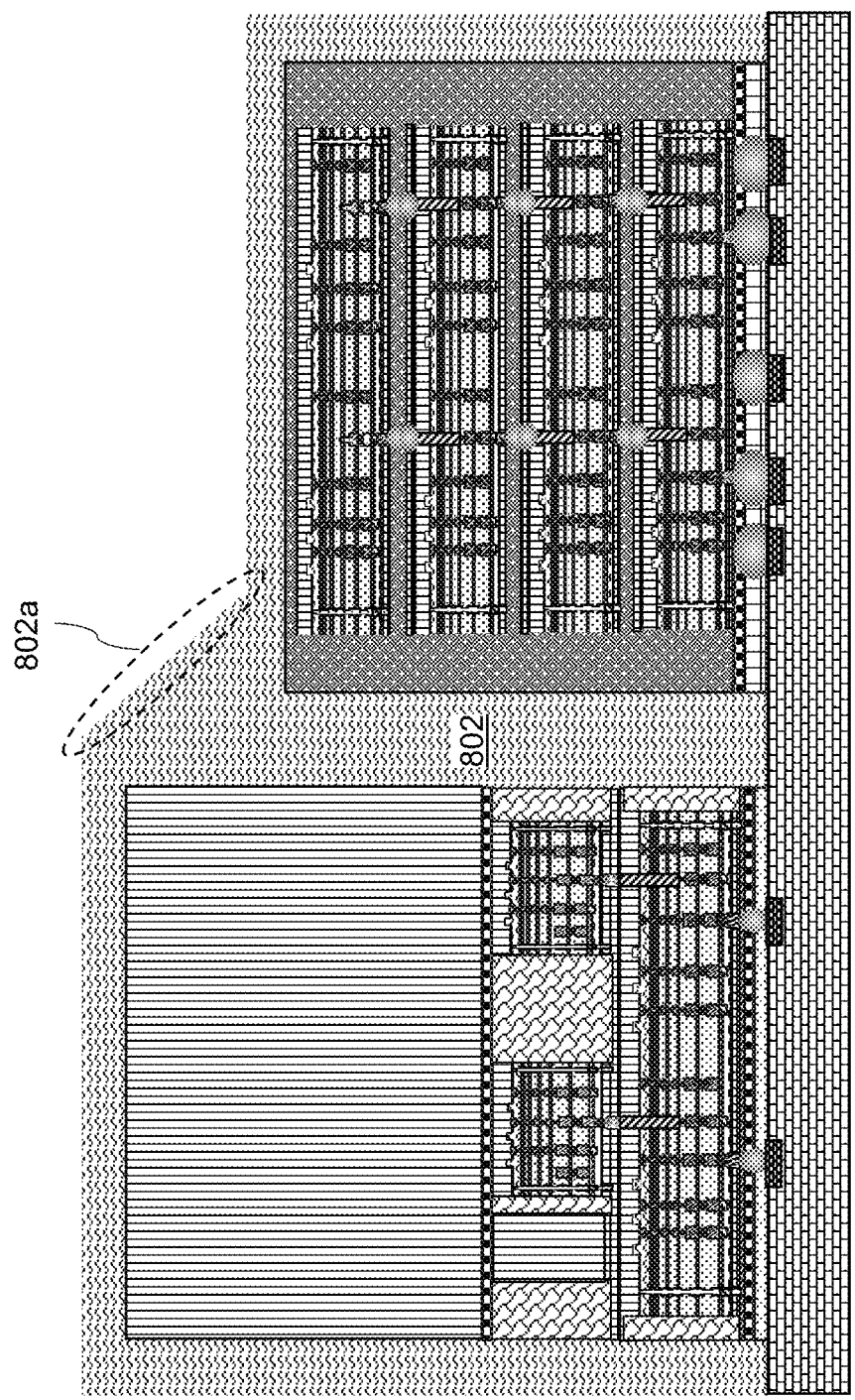
FIG. 9A is a vertical cross-sectional view of an example semiconductor package having a large unevenness in a top portion of the outer molding material layer.
Figure 9B:
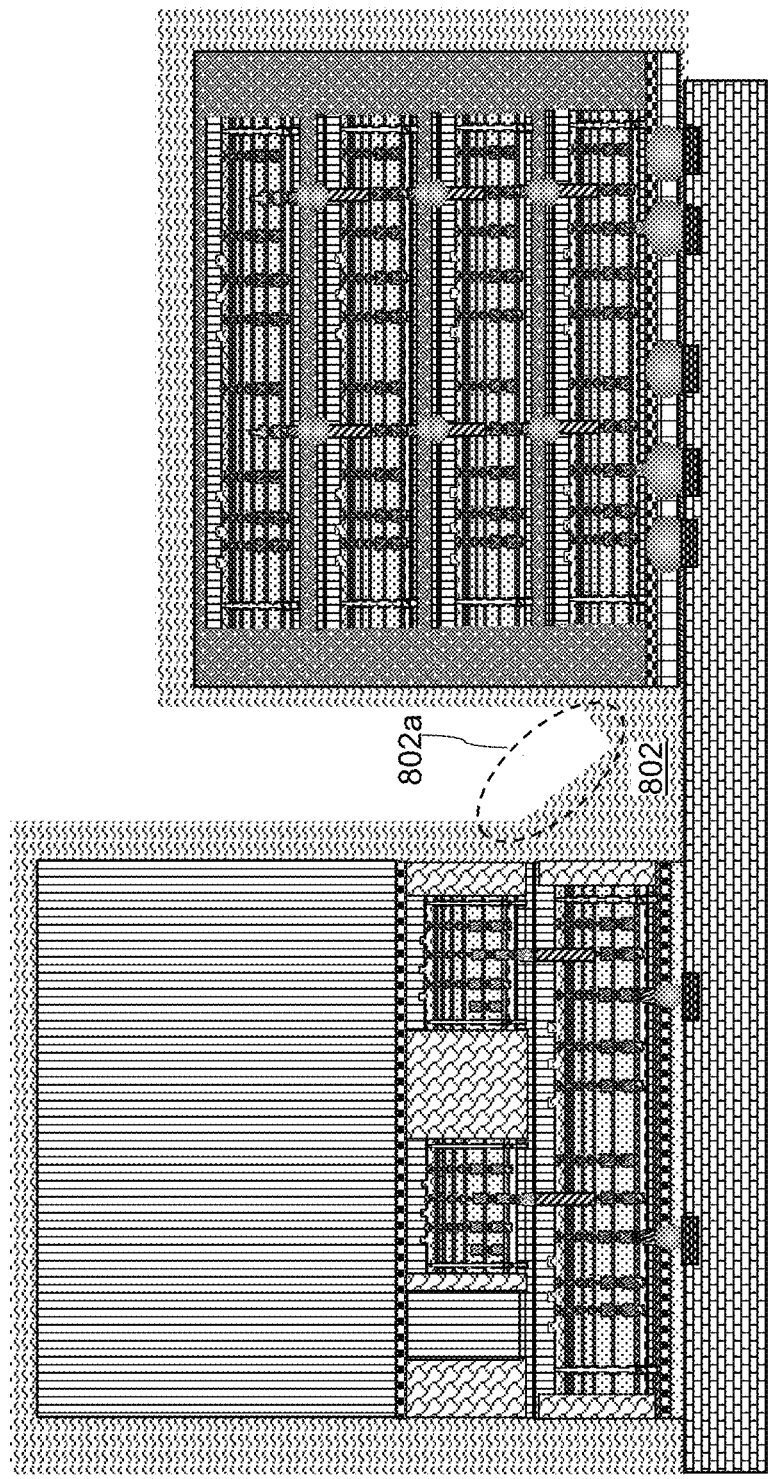
FIG. 9B is a vertical cross-sectional view of an example semiconductor package having a large unevenness in a top portion of the outer molding material layer.

FIGS. 9A and 9B are vertical cross-sectional views of examples of semiconductor packages in which the height difference D between a semiconductor die stack and first adjacent die group may be greater than 10% of the height of the semiconductor die stack 700, so that a stress caused by the outer molding material layer 802 is not evenly distributed between the semiconductor die stack 700 and the first adjacent die group 850. In particular, FIG. 9A illustrates an example where there is a large unevenness 802a in a top portion of the outer molding material layer 802 so that a top stress is not evenly distributed between the semiconductor die stack 700 and the first adjacent die group 850. FIG. 9B illustrates an example where there is a large unevenness 802a in a side portion of the outer molding material layer 802 so that a side stress is not evenly distributed between the semiconductor die stack 700 and the first adjacent die group 850.

Figure 10:
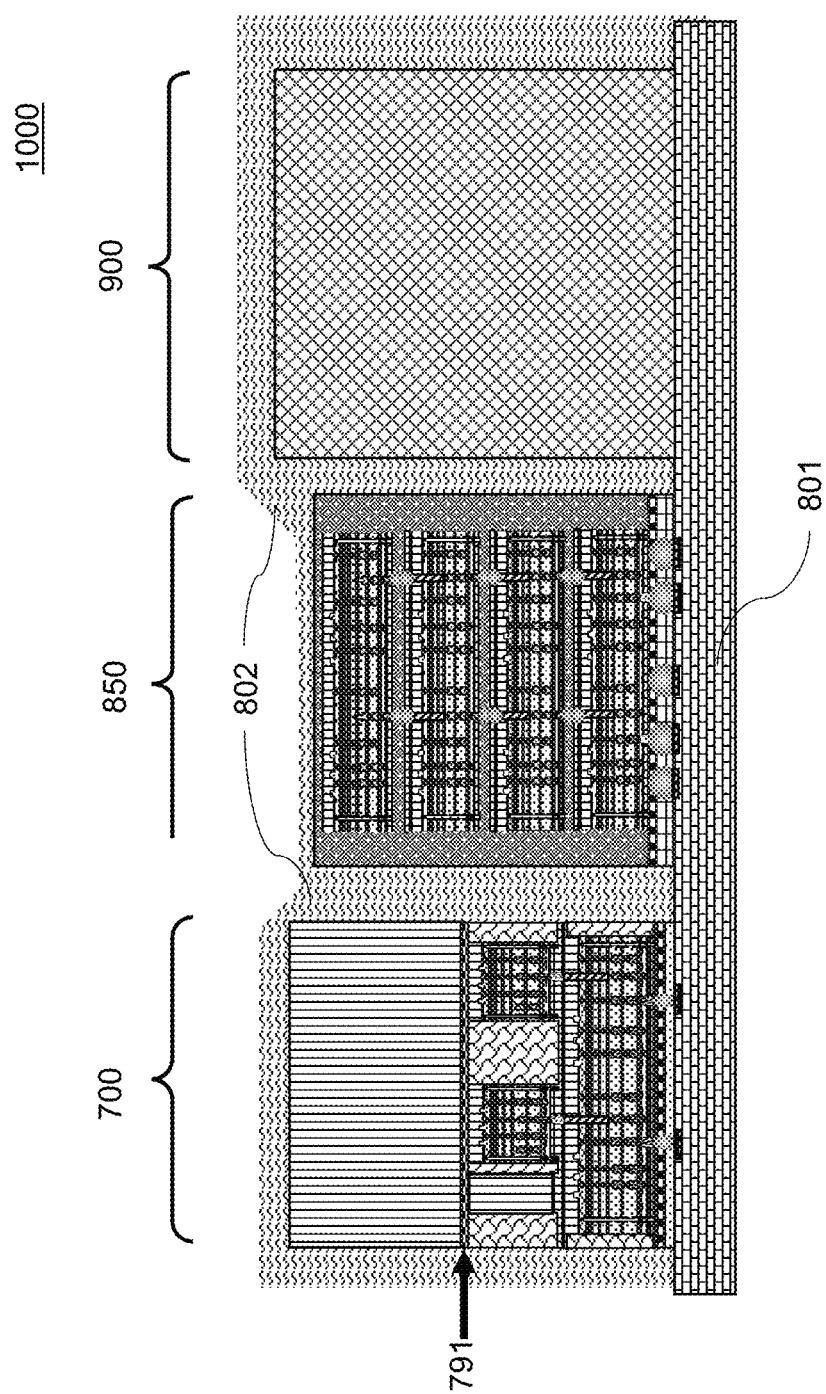
FIG. 10 is a vertical cross-sectional view of a semiconductor package according to one or more embodiments.

FIG. 10 illustrates a semiconductor package 1000 according to one or more embodiments. As illustrated in FIG. 10, the semiconductor package 1000 may include the semiconductor die stack 700, the first adjacent die group 850 and a second adjacent die group 900 that may be formed on the substrate 801 (e.g., packaging substrate). The outer molding material layer 802 may be formed over the semiconductor die stack 700, the first adjacent die group 850 and a second adjacent die group 900. The second adjacent die group 900 may be a different type than the semiconductor die stack 700 and the first adjacent die group 850. Thus, the semiconductor die stack 700 may be an SoIC chip and the first adjacent die group 850 may be an HBM chip, and therefore, the second adjacent die group 900 may be other than an SoIC chip or an HBM chip. For example, the second adjacent die group 900 may be a dummy die group that is formed of a glass material or a polymer material.

By mounting die groups of different types on the substrate 801 with the semiconductor die stack 700, a stress exerted by the outer molding material layer 802 may be more evenly distributed among the semiconductor die stack 700, the first adjacent die group 850 and the second adjacent die group 900. Therefore, a stress exerted on the bond at the interface 791 in the semiconductor die stack 700 by the outer molding material layer 802 may be reduced.

FIG. 11 illustrates a flowchart for a method of forming a semiconductor die group according to one or more embodiments. As illustrated in FIG. 11, the method may include a step 1110, which includes forming a first semiconductor die 100 on a first semiconductor wafer 10 having a first lattice direction ld1. The first semiconductor die 100 may be formed in a first array 15 that is aligned along a first horizontal direction hd1 and a second horizontal direction hd2, wherein the second horizontal direction hd2 is perpendicular to the first horizontal direction. The first lattice direction ld1 may be offset from the first horizontal direction by a first offset angle $a_1$. The first offset angle al may be greater than 0.5 degrees and less than or equal to 45 degrees. In step 1120, the method may further include forming a second semiconductor die 200 on a second semiconductor wafer 20 having a second lattice direction ld2. The second lattice direction ld2 may be different than the first lattice direction ld1. The second semiconductor die 200 may be formed in a second array 25 that is aligned along a first horizontal direction hd1 and a second horizontal direction hd2, wherein the second horizontal direction hd2 is perpendicular to the first horizontal direction. The second lattice direction ld2 may be offset from the first horizontal direction by a second offset angle $a_2$. The second offset angle $a_2$ may be greater than 0.5 degrees and less than or equal to 45 degrees. The second offset angle $a_2$ is different from the first offset angle $a_1$, such that the second lattice direction ld2 is different from the first lattice direction ld1. The method may further include step 1130, which includes aligning the first semiconductor die 100 on the first semiconductor wafer 10 with the second semiconductor die 200 on the second semiconductor wafer 20 such that an angle α is formed between the first lattice direction ld1 and the second lattice direction ld2. The method may further include the step 1140 of bonding the second semiconductor wafer 20 to the first semiconductor wafer 10. In step 1140, the second semiconductor die 200 may be bonded to the first semiconductor die 100.

Referring to FIGS. 1A-11, a semiconductor die stack 700 may include a first semiconductor die 100 having a first lattice direction ld1, and a second semiconductor die 200 bonded to the first semiconductor die 100 and having a second lattice direction ld2, wherein the first lattice direction ld1 may be different than the second lattice direction ld2. In one embodiment, the second semiconductor die 200 may be hybrid bonded to the first semiconductor die 100 by a metal-to-metal bond and a non-metal-to-non-metal bond. In one embodiment, an angle a between the first lattice direction ld1 and the second lattice direction ld2 may be greater than 0.5 degrees. In one embodiment, the second semiconductor die 200 may be bonded to the first semiconductor die 100 by a wafer-to-wafer (WtW) bond at an interface 500a, 791 between the first semiconductor die 100 and the second semiconductor die 200. In one embodiment, an upper surface of the second semiconductor die 200 may be bonded to a bottom surface of the first semiconductor die 100 by the WtW bond at the interface 500a, 791. In one embodiment, the bottom surface of the first semiconductor die 100 may include a first conductive via 150, and the upper surface of the second semiconductor die 200 may include a second conductive via 240, and the second conductive via 240 may be metal-to-metal bonded to the first conductive via 150 by the WtW bond at the interface 500a, 791. In one embodiment, the bottom surface of the first semiconductor die 100 may include a first substrate 108 surface, and the upper surface of the second semiconductor die 200 may include a bonding layer 210, and the bonding layer 210 may be fusion bonded to the first substrate 108 surface by the WtW bond at the interface 500a, 791. In one embodiment, the first semiconductor die 100 may include a first substrate 108 formed of a first semiconductor wafer 10 having the first lattice direction ld1 and the second semiconductor die 200 may include a second substrate 208 formed of a second semiconductor wafer 20 having the second lattice direction ld2. In one embodiment, the semiconductor die stack 500, 700 may further include a sidewall formed by dicing the semiconductor die stack 500, 700, from a wafer stack that may include the first semiconductor wafer 10 and the second semiconductor wafer 20, and each of the first lattice direction and the second lattice direction may be offset from a direction of the sidewall.

Referring again to FIGS. 1A-11, a method of forming a semiconductor die stack 500, 700 may include forming a first semiconductor die 100 on a first semiconductor wafer 10 having a first lattice direction ld1, forming a second semiconductor die 200 on a second semiconductor wafer 20 having a second lattice direction ld2, aligning the first semiconductor die 100 on the first semiconductor wafer 10 with the second semiconductor die 200 on the second semiconductor wafer 20 such that an angle ais formed between the first lattice direction ld1 and the second lattice direction ld2, and bonding the second semiconductor wafer 20 to the first semiconductor wafer 10 such that the second semiconductor die 200 may be bonded to the first semiconductor die 100. In one embodiment, the bonding of the second semiconductor wafer 20 to the first semiconductor wafer 10 may include hybrid bonding the second semiconductor die 200 to the first semiconductor die 100 by a metal-to-metal bond and a non-metal-to-non-metal bond. In one embodiment, the bonding of the second semiconductor wafer 20 to the first semiconductor wafer 10 may include bonding the second semiconductor wafer 20 to the first semiconductor wafer 10 such that the angle α may be greater than 0.5 degrees. In one embodiment, the bonding of the second semiconductor wafer 20 to the first semiconductor wafer 10 may include bonding the second semiconductor die 200 to the first semiconductor die 100 by a wafer-to-wafer (WtW) bond at an interface 500a, 791 between the first semiconductor die 100 and the second semiconductor die 200. In one embodiment, the bonding of the second semiconductor die 200 to the first semiconductor die 100 may include bonding an upper surface of the second semiconductor die 200 to a bottom surface of the first semiconductor die 100 by the WtW bond at the interface 500a, 791. In one embodiment, the bottom surface of the first semiconductor die 100 may include a first conductive via 150, and the upper surface of the second semiconductor die 200 may include a second conductive via 240, and the bonding of the second semiconductor die 200 to the first semiconductor die 100 may include metal-to-metal bonding the second conductive via 240 to the first conductive via 150 by the WtW bond at the interface 500a, 791. In one embodiment, the bottom surface of the first semiconductor die 100 may include a substrate surface, and the upper surface of the second semiconductor die 200 may include a bonding layer 210, and the bonding of the second semiconductor die 200 to the first semiconductor die 100 may include fusion bonding the bonding layer 210 to the substrate surface by the WtW bond at the interface 500a, 791. In one embodiment, the bonding of the second semiconductor wafer 20 to the first semiconductor wafer 10 may include forming a wafer stack 30 including the first semiconductor wafer 10 and the second semiconductor wafer 20. In one embodiment, the method may further include dicing the wafer stack 30 along dicing lines so that the semiconductor die stack 500, 700 may be separated from the wafer stack 30 and may include a sidewall formed along the dicing lines, and each of the first lattice direction and the second lattice direction may be offset from a direction of the sidewall. In one embodiment, the bonding of the second semiconductor wafer 20 to the first semiconductor wafer 10 may include flipping the first semiconductor wafer 10 such that a bottom surface of the first semiconductor wafer 10 faces upward, flipping the second semiconductor wafer 20 such that an upper surface of the second semiconductor wafer 20 faces the bottom surface of the first semiconductor wafer 10, aligning the second semiconductor die 200 with the first semiconductor die 100, and pressing the second semiconductor wafer 20 onto the first semiconductor wafer 10 such that the second semiconductor die 200 contacts the first semiconductor die 100 and becomes bonded to the first semiconductor die 100.

Referring to FIGS. 8A-10, a semiconductor package 800, 1000 may include a semiconductor die stack 700 mounted on a substrate 801 and having a first height, the semiconductor die stack 700 including a semiconductor wafer 780 having a first lattice direction, and a plurality of semiconductor dies 701, 702, 703, 720 having a second lattice direction that may be different than the first lattice direction, and a first adjacent die group 850 mounted on the substrate 801 adjacent to the semiconductor die stack 700, and having a second height, wherein the second height is within 10% of the first height. The semiconductor package 800, 1000 may also include a second adjacent die group 900 mounted on the substrate and having a type that may be different than a type of the semiconductor die stack 700, and different than a type of the first adjacent die group 850.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor die stack comprising:
a first semiconductor die in a first encapsulation layer and having a first lattice direction;
a second semiconductor die in a second encapsulation layer, stacked on the first semiconductor die and having a second lattice direction; and
a bonding layer between the first encapsulation layer and the second encapsulation layer and configured to bond the first semiconductor die to the second semiconductor die, wherein the first lattice direction comprises a major in-plane crystallographic direction of the first semiconductor die, the second lattice direction comprises a major in-plane crystallographic direction of the second semiconductor die, and an angle between the first lattice direction and the second lattice direction is greater than 0.5 degrees.

2. The semiconductor die stack of claim 1, wherein the second semiconductor die is hybrid bonded to the first semiconductor die by a metal-to-metal bond and a non-metal-to-non-metal bond.

3. The semiconductor die stack of claim 1, wherein the first lattice direction is offset from a direction of a sidewall of the first semiconductor die by a first offset angle, the second lattice direction is offset from a direction of a sidewall of the second semiconductor die by a second offset angle, and the angle between the first lattice direction and the second lattice direction comprises a difference between the first offset angle and the second offset angle.

4. The semiconductor die stack of claim 1, wherein the second semiconductor die is bonded to the first semiconductor die by a wafer-to-wafer (WtW) bond at an interface between the first semiconductor die and the second semiconductor die.

5. The semiconductor die stack of claim 4, wherein an upper surface of the second semiconductor die is bonded to a bottom surface of the first semiconductor die by the WtW bond at the interface.

6. The semiconductor die stack of claim 5, wherein the bottom surface of the first semiconductor die comprises a first conductive via, and the upper surface of the second semiconductor die comprises a second conductive via, and
wherein the second conductive via is metal-to-metal bonded to the first conductive via by the WtW bond at the interface.

7. The semiconductor die stack of claim 5, wherein the bottom surface of the first semiconductor die comprises a substrate surface, and the bonding layer is fusion bonded to the substrate surface by the WtW bond at the interface.

8. The semiconductor die stack of claim 1, wherein the first semiconductor die comprises a first substrate formed of a first semiconductor wafer having the first lattice direction and the second semiconductor die comprises a second substrate formed of a second semiconductor wafer having the second lattice direction.

9. The semiconductor die stack of claim 8, further comprising:
a sidewall formed by dicing the semiconductor die stack from a wafer stack comprising the first semiconductor wafer and the second semiconductor wafer,
wherein each of the first lattice direction and the second lattice direction are offset from a direction of the sidewall.

10. A semiconductor package comprising:
a semiconductor die stack mounted on a substrate and having a first height, the semiconductor die stack comprising:
a semiconductor wafer having a wafer lattice direction;
a first semiconductor die disposed within a first encapsulation layer and having a first lattice direction;
a second semiconductor die disposed within the first encapsulation layer and having a second lattice direction; and
a bonding layer between the first encapsulation layer and the semiconductor wafer and configured to bond the first semiconductor die and the second semiconductor die to the semiconductor wafer; and
a first adjacent die group mounted on the substrate adjacent to the semiconductor die stack, and having a second height, wherein a difference between the first height and the second height is within 10% of the first height, the wafer lattice direction comprises a major in-plane crystallographic direction of the semiconductor wafer, the first lattice direction comprises a major in-plane crystallographic direction of the first semiconductor die, the second lattice direction comprises a major in-plane crystallographic direction of the second semiconductor die, an angle between the first lattice direction and the wafer lattice direction is greater than 0.5 degrees, and an angle between the second lattice direction and the wafer lattice direction is greater than 0.5 degrees.

11. The semiconductor package of claim 10, further comprising:
a second adjacent die group mounted on the substrate and having a type that is different than a type of the semiconductor die stack, and different than a type of the first adjacent die group.

12. A semiconductor structure, comprising:
a semiconductor wafer having a wafer lattice direction;
a first semiconductor die in a first encapsulation layer and having a first lattice direction; and
a bonding layer between the first encapsulation layer and the semiconductor wafer and configured to bond the first semiconductor die to the semiconductor wafer, wherein the wafer lattice direction comprises a major in-plane crystallographic direction of the semiconductor wafer, the first lattice direction comprises a major in-plane crystallographic direction of the first semiconductor die, and an angle between the first lattice direction and the wafer lattice direction is greater than 0.5 degrees.

13. The semiconductor structure of claim 12, wherein the semiconductor wafer comprises a carry wafer.

14. The semiconductor structure of claim 12, further comprising:
a second semiconductor die bonded to the semiconductor wafer adjacent the first semiconductor die and having a second lattice direction different than the wafer lattice direction.

15. The semiconductor structure of claim 14, further comprising:
a dummy die bonded to the semiconductor wafer adjacent the second semiconductor die and having a lattice direction different than the wafer lattice direction.

16. The semiconductor structure of claim 15, further comprising:
a third semiconductor die bonded to the first semiconductor die, the second semiconductor die and the dummy die opposite the semiconductor wafer and having a third lattice direction different than the wafer lattice direction.

17. The semiconductor structure of claim 16, wherein the first semiconductor die is hybrid bonded to the third semiconductor die by a metal-to-metal bond and a non-metal-to-non-metal bond.

18. The semiconductor structure of claim 16, wherein the first lattice direction, the second lattice direction, the third lattice direction, and the lattice direction of the dummy die are substantially the same direction.

19. The semiconductor structure of claim 16, wherein a thickness of the semiconductor wafer is greater than a combined thickness of the first semiconductor die and the third semiconductor die.

20. The semiconductor structure of claim 16, wherein the first semiconductor die is positioned on the semiconductor wafer such that the first lattice direction is misaligned with the wafer lattice direction.

* * * * *